(12) United States Patent
Haukka et al.

(10) Patent No.: US 9,245,742 B2
(45) Date of Patent: Jan. 26, 2016

(54) SULFUR-CONTAINING THIN FILMS

(71) Applicant: ASM IP HOLDING B.V., Almere (NL)

(72) Inventors: Suvi P. Haukka, Helsinki (FI); Fu Tang, Gilbert, AZ (US); Michael Givens, Phoenix, AZ (US); Jan Willem Maes, Wilrijk (BE); Qi Xie, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/133,509

(22) Filed: Dec. 18, 2013

(65) Prior Publication Data

US 2015/0170907 A1    Jun. 18, 2015

(51) Int. Cl.
*H01L 21/31* (2006.01)
*H01L 21/02* (2006.01)

(52) U.S. Cl.
CPC ...... *H01L 21/02175* (2013.01); *H01L 21/0228* (2013.01); *H01L 21/0237* (2013.01); *H01L 21/0262* (2013.01); *H01L 21/02192* (2013.01); *H01L 21/02194* (2013.01); *H01L 21/02334* (2013.01); *H01L 21/02557* (2013.01); *H01L 21/02568* (2013.01); *H01L 21/02661* (2013.01); *H01L 21/02395* (2013.01)

(58) Field of Classification Search
USPC .......................................................... 438/779
See application file for complete search history.

(56) References Cited

U.S. PATENT DOCUMENTS

| | | | |
|---|---|---|---|
| 4,354,198 A | 10/1982 | Hodgson et al. | |
| 4,751,200 A | 6/1988 | Gmitter et al. | |
| 5,124,278 A | 6/1992 | Bohling et al. | |
| 5,168,077 A | 12/1992 | Ashizawa et al. | |
| 5,393,680 A | 2/1995 | Shikata | |
| 5,451,542 A | 9/1995 | Ashby | |
| 5,646,419 A | 7/1997 | McCaldin et al. | |
| 5,760,462 A | 6/1998 | Barron et al. | |
| 6,112,013 A | 8/2000 | Hsiao et al. | |
| 6,117,720 A | 9/2000 | Harshfield | |

(Continued)

FOREIGN PATENT DOCUMENTS

| EP | 0 265 314 A1 | 4/1988 |
|---|---|---|
| EP | 2 068 368 A2 | 6/2009 |

(Continued)

OTHER PUBLICATIONS

Leskela et al., "Atomic layer deposition (ALD): from precursors to thin film structures", Thin Solid Films, vol. 409, (2002), pp. 138-146.

(Continued)

*Primary Examiner* — Timor Karimy

(74) *Attorney, Agent, or Firm* — Knobbe Martens Olson & Bear LLP

(57) ABSTRACT

In some aspects, methods of forming a metal sulfide thin film are provided. According to some methods, a metal sulfide thin film is deposited on a substrate in a reaction space in a cyclical process where at least one cycle includes alternately and sequentially contacting the substrate with a first vapor-phase metal reactant and a second vapor-phase sulfur reactant. In some aspects, methods of forming a three-dimensional architecture on a substrate surface are provided. In some embodiments, the method includes forming a metal sulfide thin film on the substrate surface and forming a capping layer over the metal sulfide thin film. The substrate surface may comprise a high-mobility channel.

12 Claims, 5 Drawing Sheets

(56) References Cited

U.S. PATENT DOCUMENTS

| | | | |
|---|---|---|---|
| 6,150,253 A | 11/2000 | Doan et al. | |
| 6,207,976 B1 | 3/2001 | Takahashi et al. | |
| 6,380,097 B1 | 4/2002 | Dauplaise et al. | |
| 6,445,015 B1 * | 9/2002 | Braddock | 257/192 |
| 6,534,368 B2 | 3/2003 | Zahorik | |
| 6,635,951 B1 | 10/2003 | Zahorik | |
| 6,670,651 B1 | 12/2003 | Braddock | |
| 6,709,958 B2 | 3/2004 | Li et al. | |
| 6,710,423 B2 | 3/2004 | Moore et al. | |
| 6,727,192 B2 | 4/2004 | Moore et al. | |
| 6,730,547 B2 | 5/2004 | Li et al. | |
| 6,734,455 B2 | 5/2004 | Li | |
| 6,791,125 B2 * | 9/2004 | Demkov et al. | 257/192 |
| 6,812,087 B2 | 11/2004 | Giltom et al. | |
| 7,094,651 B2 | 8/2006 | Mitzi et al. | |
| 7,094,700 B2 | 8/2006 | Li et al. | |
| 7,307,277 B2 | 12/2007 | Frey et al. | |
| 7,341,960 B2 | 3/2008 | Lee et al. | |
| 7,394,088 B2 | 7/2008 | Lung | |
| 7,619,248 B1 | 11/2009 | Cleeves | |
| 7,678,708 B2 | 3/2010 | Vaartstra et al. | |
| 7,964,490 B2 | 6/2011 | Clendenning et al. | |
| 8,796,125 B2 | 8/2014 | Rockenberger et al. | |
| 2002/0041931 A1 | 4/2002 | Suntola et al. | |
| 2002/0106849 A1 | 8/2002 | Moore | |
| 2005/0257824 A1 | 11/2005 | Maltby et al. | |
| 2007/0111429 A1 | 5/2007 | Lung | |
| 2008/0006930 A1 | 1/2008 | Ichida | |
| 2008/0083924 A1 | 4/2008 | Song et al. | |
| 2008/0272355 A1 | 11/2008 | Cho et al. | |
| 2010/0059820 A1 | 3/2010 | Ohmi et al. | |
| 2010/0072451 A1 | 3/2010 | Terao et al. | |
| 2010/0159135 A1 | 6/2010 | Bent et al. | |
| 2010/0203672 A1 | 8/2010 | Eun et al. | |
| 2011/0124141 A1 | 5/2011 | Goeoetz et al. | |
| 2011/0147795 A1 | 6/2011 | Rachmady et al. | |
| 2013/0270505 A1 | 10/2013 | Dahmani | |
| 2014/0027884 A1 | 1/2014 | Tang et al. | |

FOREIGN PATENT DOCUMENTS

| | | | |
|---|---|---|---|
| KR | 20040038514 | * | 5/2004 |
| WO | WO 97/48499 | | 12/1997 |
| WO | WO 02/15285 A1 | | 2/2002 |
| WO | WO 03/019691 A2 | | 3/2003 |
| WO | WO 2004/032242 A1 | | 4/2004 |

OTHER PUBLICATIONS

Hsueh, C., "Alternative Materials for Next-Generation Transistors: High-k/Ge based MOSFET", A dissertation submitted to the Graduate School-New Brunswick Rutgers, 2008, 139 pages.

Lin, J., "Low Resistance Contacts to N-Type Germanium", A dissertation submitted to the Department of Electrical Engineering, Jun. 2013, 136 pages.

International Search Reporting for International Application No. PCT/US2014/066316, Notification mailed Mar. 3, 2015.

Alian, et al., "Ammonium sulfide vapor passivation of / $In_{0.53}Ga_{0.47}As$ and InP surfaces," Applied Physics Letters, vol. 99, Issue 11, pp. 112114-112114-3, Sep. 2011.

Alian, et al., "Oxide trapping in InGaAs-$Al_2O_3$ system and the role of sulfur in reducing the $Al_2O_3$ trap density," Electron Device Letters, vol. 33, Issue 11, pp. 1544-1546, Sep. 21, 2012.

Brennan, B.Sc., "Surface and interface characterization of high-k dielectric materials on silicon and III-V semiconductor substrates," Dublin City University, School of Physical Sciences, Dec. 2009.

Genevee, et al. "Atomic layer deposition of zinc indium sulfide films: Mechanistic studies and evidence of surface exchange reactions and diffusion processes," Journal of Vacuum Science & Technology A., vol. 31, Issue 1, Jan./Feb. 2013.

Ihanus, et al., "Atomic Layer Deposition of SrS and BaS Thin Films Using Cyclopentadienyl Precursors," Chemistry of Materials, vol. 14, Issue 5, pp. 1937-1944, May 2002.

Kukli, et al., "Controlled Growth of Yttrium Oxysulphide Thin Films by Atomic Layer Deposition," Materials Science Forum, vols. 315-317, pp. 216-221, dated 1999.

Misra, "High k dielectrics on High-Mobility Substrates: The Interface!" The Electrochemical Society, pp. 47-51, Winter 2011.

O'Connor, et al., "A systematic study of $(NH_4)_2S$ passivation (22%, 10%, 5%, or 1%) on the interface properties of $Al_2O_3$/$In_{0.53}Ga_{0.47}As$/InP system for n-type and p-type $In_{0.53}Ga_{0.47}As$ epitaxial layers," Journal of Applied Physics, vol. 109, Issue 2, pp. 024101-024101-10, dated 2011.

O'Connor, et. al., "Analysis of the minority carrier response of n-type and p-type Au/ Ni/ Al2O3/In0.53Ga0.47/InP capacitors following an optimized (NH4)2S treatment," Applied Physicas Letters, vol. 99, Issue 21, pp. 212901-212901-3, dated 2011.

\* cited by examiner

SULFUR-CONTAINING THIN FILMS

BACKGROUND OF THE INVENTION

1. Field of the Invention

The invention relates generally to the field of semiconductor device manufacturing and, more particularly, to metal sulfide films and methods for forming sulfur-containing thin films, such as by atomic layer deposition ("ALD") processes. For example, metal sulfide films such as MgS films may be formed by ALD processes and may serve as an interface layer between a substrate and a dielectric layer.

2. Description of the Related Art

In an effort to continue to enhance the performance of high-k metal gate technology, the semiconductor industry has shown interest in high-mobility substrate materials, such as germanium, which exhibits desirable hole mobility, and group III-V materials, which exhibit desirable electron mobility. Suitable group III-V materials include, for example, GaAs, InP, InGaAs, InAs, and GaSb. However, problems with these new channel materials can be present at the interface between the high-mobility material and the overlying dielectric layer.

The high-mobility semiconducting channel, based on materials such as Ge and InGaAs, have a very high number of interface states. These states tend to pin the Fermi energy and can severely deteriorate the function of electronic devices. Sulfur passivation can be an efficient approach to minimize the interface states. Beyond passivating the surface, an interface layer is desirable for integration with a high-k dielectric layer. However, known interface layers have a variety of problems, such as not preventing oxidation of the underlying high-mobility channel and allowing for undesirable current leakage or charge trapping and not preventing up diffusion of group III-V elements or Ge into the gate dielectric.

SUMMARY OF THE INVENTION

In some aspects, methods of forming a metal sulfide thin film are provided. According to some methods, a metal sulfide thin film is deposited on a substrate in a reaction space in a cyclical process where at least one cycle includes alternately and sequentially contacting the substrate with a first vapor-phase metal reactant and a second vapor-phase sulfur reactant. In some embodiments, the metal reactant comprises a metal selected from the group consisting of Mg, Ca, Y, Sc, Sr, Ba, La, and other lanthanides.

In some embodiments, a method for forming a metal sulfide thin film includes removing excess vapor-phase metal reactant and reaction byproducts from the reaction space after contacting the substrate with the first vapor-phase metal reactant. In some embodiments, excess vapor-phase sulfur reactant and reaction byproducts from the reaction space after contacting the substrate with the second vapor-phase sulfur reactant. In some embodiments, the second reactant is introduced into the reaction space before introducing the vapor-phase metal reactant into the reaction space in at least one deposition cycle.

According to some embodiments, the metal sulfide film is formed using a metal reactant having at least one cyclopentadienyl (Cp) ligand. In some embodiments, the metal of the metal sulfide thin film is magnesium (Mg). In some embodiments, the metal reactant is $Mg(Cp)_2$ or a derivative thereof. In some embodiments, the metal reactant comprises Cp or a derivative thereof and the metal is Ca, La or another lanthanide, Sc, or Y. In some embodiments, the metal reactant includes a metal that is not present in the portion of the substrate surface upon which the metal sulfide thin film is being formed.

According to some embodiments, a method for forming a metal sulfide thin film includes $H_2S$ as a sulfur precursor or reactant. In some embodiments, the second reactant, or sulfur precursor, comprises sulfur atoms, sulfur-containing plasma, or sulfur-radicals. In some embodiments, the resulting metal sulfide thin film comprises MgS.

According to some embodiments, the substrate surface on which the metal sulfide film is deposited does not include silicon. In some embodiments, the substrate surface comprises InGaAs. In some embodiments, the metal sulfide thin film comprises more than one metal. In some embodiments, the metal sulfide thin film comprises non-metals in addition to sulfur, such as oxygen or nitrogen. In some embodiments, a method for forming a metal sulfide thin film includes subjecting the substrate to a pretreatment reactant either ex situ or in situ prior to depositing the metal sulfide thin film. In some embodiments the metal sulfide film is subjected to a post-treatment reactant after deposition.

In some embodiments, the metal sulfide thin film has a thickness of between about 1 Å and about 20 Å.

In some aspects, methods of forming a magneiusm sulfide thin film are provided. In at least some methods, the magneiusm sulfide thin film is formed on a substrate in a reaction space in one or more deposition cycles. In some embodiments, the deposition cycles include providing a vapor-phase magnesium reactant to the reaction space, removing excess vapor-phase magnesium reactant and reaction by-products, providing a second reactant comprising sulfur to the reaction space, and removing excess second reactant and reaction by-products.

According to some embodiments, the second reactant is provided to the reaction space before providing the vapor-phase magnesium reactant to the reaction space. In some embodiments, the magnesium sulfide thin film comprises at least one metal other than magnesium. In some embodiments the magnesium sulfide film comprises at least one non-metal element other than sulfur, such as nitrogen or oxygen.

In some aspects, methods of forming a three-dimensional architecture on a substrate surface are provided. In some embodiments, the method includes forming a metal sulfide thin film on the substrate surface and forming a capping layer over the metal sulfide thin film. In some embodiments, the substrate surface comprises a high-mobility channel. In some embodiments, the metal of the metal sulfide thin film comprises at least one of the following: beryllium, magnesium, calcium, strontium, scandium, yttrium, and lanthanum.

According to some embodiments, a method of forming a three-dimensional architecture includes subjecting the substrate surface to a pretreatment process prior to forming a metal sulfide thin film on the substrate surface. In some embodiments, the pretreatment process comprises subjecting the substrate surface to at least one of the following pretreatment reactants: $(NH_4)_2S$, $H_2S$, HCl, HBr, $Cl_2$, and HF. In some embodiments, the pretreatment process comprises exposing the substrate surface to at least one pretreatment reactant for a period of between about 1 second and about 600 seconds, preferably between about 1 second and about 60 seconds. In some embodiments, after forming a capping layer over the metal sulfide thin film, a barrier layer is formed over the capping layer. Some embodiments include, after forming a capping layer over the metal sulfide thin film, forming a metal gate over the capping layer. Some embodiments include subjecting the metal sulfide thin film and the capping layer to a post deposition treatment comprising an annealing process or a gas forming process.

In some embodiments, the metal of the metal sulfide thin film is different from the metal or metals of the underlying substrate surface. In some embodiments, the metal of the metal sulfide thin film is different from the metal or metals of the subsequently formed capping layer. In some embodiments, the metal of the metal sulfide thin film is the same as at least one of the metal or metals of the subsequently formed capping layer. According to some embodiments, the capping layer comprises a high-k dielectric material. And in some embodiments, the substrate surface comprises a high-mobility channel.

In some embodiments, the metal of the metal sulfide thin film comprises at least one of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W. According to some embodiments, the metal sulfide thin film has a thickness between about 5 Å and about 20 Å.

In some aspects, methods of forming a three-dimensional architecture on a substrate surface are provided. Some methods include forming a metal sulfide thin film on the substrate surface using an ALD process and forming a capping layer comprising a high-k dielectric material over the metal sulfide thin film. In some embodiments, the metal of the metal sulfide thin film comprises at least one of the following metals: Be, Mg, Ca, Ba, Sr, Y, Sc, La, Ce, Pr, Nd, Pm, Sm, Eu, Gd, Tb, Dy, Ho, Er, Tm, Yb, Lu, Al, Si, Zn, Cd, Pb, In, Ga, Ge, Gd, Ta, Mo, and W. In some embodiments, the metal sulfide thin film is formed using a sulfur precursor selected from the following: elemental sulfur, sulfur plasma, $H_2S$, and $(NH_4)_2S$.

According to some embodiments, the method includes subjecting the substrate surface to a pretreatment process prior to forming a metal sulfide thin film on the substrate surface, wherein the pretreatment process comprises exposing the substrate surface to at least one of the following: HCl, HF, $H_2S$, HBr, $Cl_2$, and HF. In some embodiments, the method includes subjecting the previously formed capping layer and metal sulfide thin film to a post deposition treatment, wherein the post deposition treatment comprises exposure to at least one of the following compounds or processes: HCl, HF, $H_2S$, $(NH_4)_2S$, $H_2$ plasma, $NF_3$, thermal $H_2$ bake, and an annealing process. Some methods include, after forming a capping layer over the metal sulfide thin film, forming a metal gate over the capping layer, wherein the metal gate comprises at least one of the following: Ti, Al, Zr, Hf, V, Ta, Nb, Cr, Mo, W, Co, TiN, TiC, TiAlC, TaC, TaAlC, NbAlC, TiAl, TaAl, TaN, TaCN, WN, and TiWN.

According to some embodiments, the metal of the metal sulfide thin film is different from one or both of the metal or metals of the underlying substrate surface and the metal or metals of the capping layer. In some embodiments, the substrate surface comprises a high-mobility channel, wherein the high-mobility channel includes germanium or a III-V material.

BRIEF DESCRIPTION OF THE DRAWINGS

The invention will be better understood from the detailed description and from the appended drawings, which are meant to illustrate and not to limit the invention, and wherein.

DETAILED DESCRIPTION

In some embodiments, metal sulfide films and methods of forming metal sulfide thin films are provided. In some embodiments, the metal of the metal sulfide thin film may be selected from any number of metals, such as beryllium, magnesium, yttrium, calcium, strontium, barium, lanthanum and other lanthanides (such as cerium, praseodymium, neodymium, promethium, samarium, europium, gadolinium, terbium, dysprosium, holmium, erbium, thulium, ytterbium, and lutetium), silicon, zinc, cadmium, lead, indium, gallium, germanium, tantalum, molybdenum, and tungsten.

Figure 1:
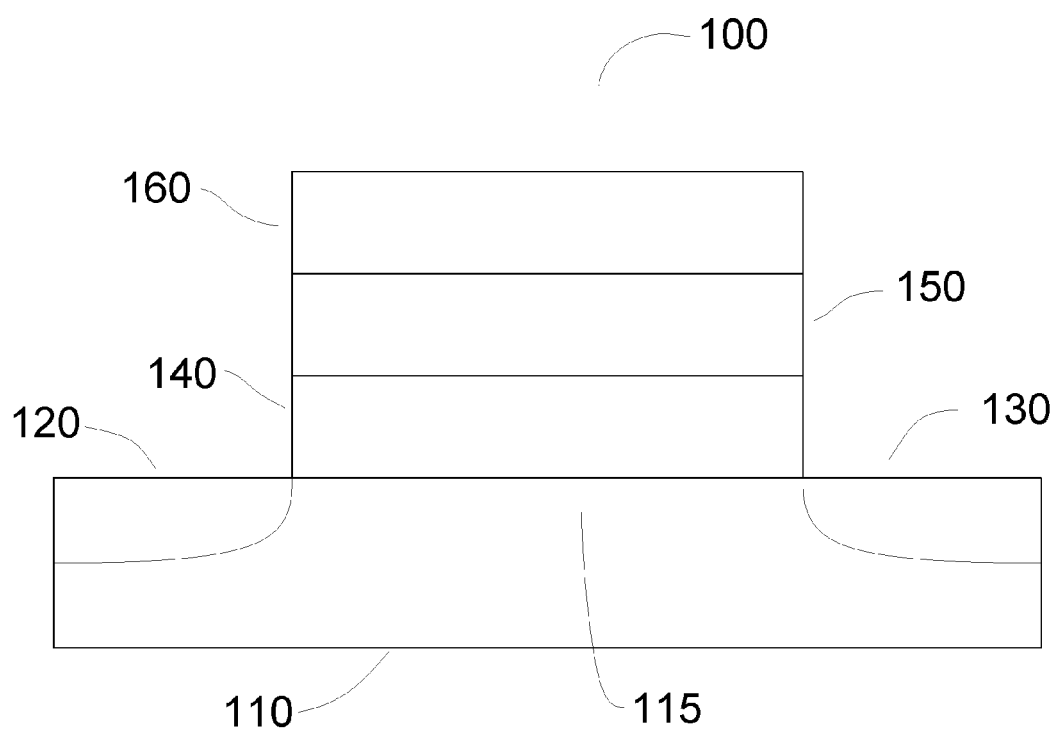
FIG. 1 is a schematic representation of a gate stack that includes an interfacial layer.

In some embodiments, a metal sulfide film is used as an interface layer, for example between a substrate and a dielectric layer. In some embodiments, the interface layer comprises a part of a gate stack. In some embodiments, the interface layer is located between a dielectric layer and a high-mobility channel. FIG. 1 illustrates a common gate stack configuration 100 that is formed on a substrate 110. A high mobility channel 115 is located between a source 120 and a drain 130. A metal sulfide interface layer 140 may be included between the high-mobility channel and the dielectric layer 150. A metal gate 160 is present over the dielectric layer 150. In some embodiments the metal sulfide interface layer 140 may be formed using the methods described herein.

In some embodiments, the metal in the metal sulfide thin film is chosen so as to be distinct from the metal in the underlying portion of the substrate. For example the metal in a metal sulfide film may be different from any metal in an underlying high-mobility channel. In some embodiments the metal in the metal sulfide film may be different from the metal in an overlying dielectric layer. In some embodiments a metal sulfide interlayer may comprise a metal that is different from any metal in an underlying channel region of the substrate and from an overlying dielectric layer.

In some embodiments a metal sulfide interface layer comprises one or more of MgS, CaS, $ScS_x$, $YS_x$, LaS, a lanthanide sulfide, $Al_2S_3$, $SiS_2$, ZnS, CdS, SrS, CaS, BaS, PbS, $In_2S_3$, $Ga_2S_3$, $GeS_2$, $Gd_2S_3$, $TaS_2$, $MoS_2$ and $WS_2$. In some embodiments when a metal sulfide thin film forms a part of a three-dimensional architecture, particular metals are expressly avoided, such as cesium and/or aluminum.

In some embodiments, suitable interfacial layers comprise a metal sulfide material that may protect the underlying high-mobility substrate material from undesirable oxidation. In some embodiments, the metal sulfide thin film may be considered a passivation layer. In some embodiments, gate stacks formed with the presently disclosed interfacial layers exhibit reduced leakage or reduced charge.

The presently disclosed metal sulfide films may be incorporated into a variety of integrated circuit architectures, such as FINFETs, planar transistors, vertical nanowire transistors, capacitors, power transistors, etc.

In some embodiments, the methods for forming metal sulfide thin films comprise an ALD process. For example, a substrate may be alternately and sequentially contacted with a first reactant comprising metal (also referred to as a metal precursor) and a second reactant comprising sulfur (also referred to as a sulfur precursor). The metal precursor may be selected to provide the desired metal in the metal sulfide interface layer. Thus, in some embodiments the metal reactant is selected to provide a metal that is different from a metal in the underlying substrate region and/or from a metal in a dielectric layer that is to be subsequently deposited. In some embodiments a metal sulfide film comprising one or more of MgS, CaS, $ScS_x$, $YS_x$ and lanthanide sulfides is deposited by an ALD process.

In some embodiments, methods of forming a metal sulfide film comprise an ALD cycle in which a metal source chemical and a sulfur source chemical are alternatively and sequentially pulsed into a reaction space comprising a substrate. The metal source chemical is provided to the reaction space where at least some of the metal source chemical contacts and adsorbs to the substrate surface. The sulfur source chemical is subsequently provided to the reaction space and reacts with the adsorbed metal source chemical to form metal sulfide. In some embodiments, the sulfur source chemical may precede the metal source chemical. In some such embodiments the sulfur may bond to the substrate and the subsequent metal source chemical reacts with the deposited sulfur, or the sulfur source chemical may change or remove and replace the surface termination to $SH_x$-groups or other surface species comprising sulfur.

In some embodiments, reactants and reaction by-products are removed from the reaction space between provision of the metal source chemical and the sulfur source chemical. Removal may occur before and/or after each reactant pulse. Reactants and reaction by-products may be removed with the aid of a purge gas and/or by subjecting the reaction space to a low pressure produced by a vacuum pump to evacuate the reaction space.

The step of exposing the substrate to a metal source chemical may be referred to as a metal phase, and the step of exposing the substrate to a sulfur source chemical may be referred to as a sulfur phase. In some embodiments, it may be desirable to repeat one or both of the metal phase and the sulfur phase one, two, three, four, five or more times before proceeding to the next phase.

Such an ALD cycle is repeated as desired to form a film of a desirable thickness. In some embodiments, the ALD cycle is repeated until a complete, closed layer of a metal sulfide is formed. In some embodiments, the ALD cycle is repeated until a physically continuous layer of a metal sulfide is formed. In some embodiments, the ALD cycle is repeated until a minimum thickness is reached in which the deposited layer gives desired electrical properties. In some embodiments, the desirable thickness will be a thickness considered thick enough to completely cover a channel area of the substrate surface. In some embodiments, the desirable thickness is a thickness sufficient to substantially prevent oxidation of the underlying channel material of the substrate, such as during subsequent processing.

In some embodiments, a substrate surface may be subjected to a pretreatment process. In some embodiments, a pretreatment process comprises exposing the substrate surface to a pretreatment reactant that removes undesirable contaminants and/or prepares the substrate surface for the subsequent formation of a metal sulfide layer. A pretreatment may comprise, for example, providing one or more of a pulse or a rinse of HCl, HF, or a sulfur-containing compound, such as $H_2S$. In some embodiments, a pretreatment may comprise a sulfur passivation process.

In some embodiments, metal sulfides are formed that consist essentially of metal and sulfur. In some embodiments, additional reactants may be used to incorporate into or contribute other materials to the film, for example oxygen to form metal oxysulfides. In some embodiments a compound metal sulfide may be formed, comprising two or more different metals. For example, a metal sulfide film may comprise AlMgS, MgSiS or MgHfS. In some embodiments where additional non-metal elements in addition to sulfur are desired, an ALD process for forming the metal sulfide thin film may comprise phases in addition to the initial metal and sulfur phases. For example, they may include an oxidation phase where metal oxysulfides are desired. In an oxidation phase, oxygen or an oxygen-containing precursor is provided in the reaction chamber and allowed to contact the substrate surface. The oxygen phase may be part of one or more deposition cycles. In some embodiments, a separate nitrogen phase may be included in one or more deposition cycles. In some embodiments a second metal phase may be provided in one or more deposition cycles. The oxidation phase, or other desirable phase, may follow the metal phase or the sulfur phase, but in either situation, it is desirable in some embodiments, to remove excess oxygen (or other reactant) and any reaction by-products from the reaction space before proceeding to the next phase. In some embodiments an additional phase, such as an oxygen, nitrogen or additional metal phase may be provided after the final deposition cycle, or intermittently in the deposition process.

According to some embodiments, a desirable metal sulfide of the present disclosure will include one or more metals and at least one element (such as oxygen or nitrogen) in addition to sulfur. Thus, ternary and quaternary compositions would serve as suitable metal sulfides. Examples include, but are not limited to, MgHfOS, MgSN, etc.

In some embodiments, the deposited metal sulfide comprises at least about 5 at-% of sulfur, preferably more than about 15 at-% of sulfur and more preferably more than about 30 at-% of sulfur and most preferably more than about 40 at-% of sulfur. Depending on the metal oxidation state the metal sulfide may comprise sulfur from about 45 at-% to about 75 at-%.

In some embodiments, a magnesium sulfide ($MgS_x$) is formed. In some embodiments, the metal sulfide thin film may comprise other metals, such as calcium, strontium, barium, lanthanum and/or other lanthanides, as described in more detail elsewhere.

In some embodiments, such as where the metal sulfide thin film is incorporated into a three-dimensional architecture, metals in addition to those listed above may be considered for use in forming the metal sulfide thin film. Metals, such as yttrium, silicon, zinc, cadmium, lead, indium, gallium, germanium, tantalum, molybdenum, and tungsten could be suitably utilized. In some embodiments, the chosen metal may be selected based on, for example, the substrate and/or the dielectric layer used in the architecture. For example, in some embodiments it is desirable that the metal sulfide thin film, when acting as an interface layer between a high-mobility channel and a dielectric layer, utilize a metal that is distinct from the metals used in one or both the channel and the dielectric layer. In an embodiment where a three-dimensional architecture is formed, it may be desirable to subject the high-mobility channel or substrate to a pretreatment prior to forming a metal sulfide interface layer. A dielectric layer is then formed over the metal sulfide, and a post deposition treatment may be applied before, after, or before and after the formation of the dielectric layer. A subsequent layer, such a metal gate can then be formed over the dielectric layer.

Geometrically challenging applications are also possible due to the nature of the ALD-type processes. The substrate surface may comprise one or more three-dimensional structures. In some embodiments one or more structures may have an aspect ratio of 1:1 to 10:1 or greater.

The film formed according to some embodiments is between about 1 Å and about 20 Å; however, the actual thickness chosen may depend on the intended application of the thin film. In some embodiments a metal sulfide film is about 15 Å or less, for example about 10 Å. On the other hand, in some applications a thickness greater than 20 Å, 30 Å, or even 40 Å is desirable.

Atomic Layer Deposition ("ALD") of Metal Sulfide Thin Films

ALD type processes are based on controlled, self-limiting surface reactions and can provide precise control of the film composition. Gas phase reactions are avoided by contacting the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants.

Briefly, a substrate is loaded into a reaction chamber and is heated to a suitable deposition temperature, generally at lowered pressure. In some embodiments, the substrate surface on which deposition is to take place comprises silicon. In some embodiments the substrate surface on which deposition is to take place comprises germanium. In some embodiments, the substrate surface comprises one or more III-V materials. In some embodiments, the substrate surface on which deposition is to take place comprises a high-mobility material. In some embodiments, the substrate surface comprises InGaAs. Other suitable substrate surfaces include, GaAs, InP, InAs, and GaSb. In some embodiments the substrate may be a 300 mm or a 450 mm wafer. In some embodiments, the substrate surface comprises multiple materials, such as one or more III-V materials, silicon, silicon oxide, silicon nitride, $Si_xGe_{1-x}$ or Ge.

Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved. The reaction temperature may be from about room temperature to about 500° C. or from about 20° C. to about 500° C. In some embodiments, the reaction temperature is from about room temperature to about 400° C. In some embodiments, the reaction temperature is from about 150° C. to about 400° C., from about 200° C. to about 350° C., or from about 250° C. to about 300° C.

The reaction pressure may be from about 0.1 Torr to about 760 Torr. In some embodiments, the reaction pressure may be from about 0.5 Torr to about atmospheric pressure.

In some embodiments, at least one ALD cycle is used to form a metal sulfide thin film. The film formed according to some embodiments is between about 1 Å and about 20 Å; however, the actual thickness chosen may be selected based on the intended application of the thin film. In some embodiments, it is desirable to ensure that all or most of a target substrate surface is covered by the interfacial layer. In such cases, it may be desirable to form a film that is at least about 5 Å, preferably 10 Å thick or greater than 10 Å. In some embodiments, thicknesses of 2 Å, 3 Å, 4 Å, or even 5 Å will sufficiently cover the target substrate surface, e.g., a channel region. In some embodiments, such as where the film is to be incorporated into a capacitor, it may be desirable to limit the film's thickness to no more than about 20 Å with 15 Å or even 10 Å being the most desirable in some cases. It has been found, in some cases, that capacitance is undesirably reduced if too thick of a film is used. For other applications, thicknesses greater than about 20 Å may be desirable. For example, films having a thickness of 30 Å, 40 Å, or greater than 40 Å may be desirable in some applications, such as power transistors. Because of the various constraints and advantages of the film's thickness, in some embodiments it may be desirable to form films having a thickness that is between about 5 Å and about 10 Å. In some embodiments it may be desirable to form films with certain number of deposition cycles, such from about 5 deposition cycles to about 20 deposition cycles, preferably from about 7 cycles to about 15 cycles, instead of a target thickness.

As mentioned above, each pulse or phase of each cycle is preferably self-limiting. An excess of reactant is supplied in each phase to saturate the susceptible structure surfaces. Surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and thus maximum conformality. In some embodiments, less than a complete monolayer is deposited in one or more cycles, for example due to steric hindrance. In some embodiments, more than one monolayer may be deposited by, for example, adjusting the conditions to achieve some decomposition reaction, such as would occur in CVD or CVD-like processes. Limited CVD reactions mixed with the self-limiting ALD reactions can raise the deposition rate.

Examples of suitable reactors that may be used include commercially available ALD equipment such as the F-120® reactor, Pulsar® reactor and Advance® 400 Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used.

In some embodiments the reactor is a batch reactor and has more than about 50 substrates, more than about 100 substrates or more than about 125 substrates. In some embodiments the reactor is a mini-batch reactor and has from about 2 to about 20 substrates, from about 3 to about 15 substrates or from about 4 to about 10 substrates.

The metal sulfide ALD processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Preferably, for forming metal sulfide films, each ALD cycle comprises at least two distinct phases. The provision and removal of a reactant from the reaction space may be considered a phase. For a metal deposition cycle, in a first metal phase, a first reactant comprising a suitable metal—such as magnesium, calcium, strontium, barium, scandium, yttrium, or a lanthanide—is provided and forms no more than about one monolayer on the substrate surface. This reactant is also referred to herein as "the metal precursor," "metal reactant," or "metal source chemical" and may be, for example, the corresponding beta-diketonate precursors and cyclopentadienyl-based precursors of the metals listed above. In a second sulfur phase, a second reactant comprising sulfur is provided and may convert adsorbed metal reactant to a metal sulfide. This reactant is also referred to herein as "the sulfur precursor," "sulfur reactant," or "sulfur source chemical" and may be, for example, ammonia sulfide $((NH_4)_2S)$, aqueous solution of $(NH_4)_2S$, or hydrogen sulfide $(H_2S)$. One or more of the reactants may be provided with the aid of a carrier gas, such as $N_2$, Ar or He. Additional phases may be added and phases may be removed as desired to adjust the composition of the final film.

The terms "first" and "second" may be applied to any particular precursor depending on the sequencing of any particular embodiment. For example, depending on the embodiment the first reactant can be either a metal precursor or a sulfur precursor.

Figure 2:
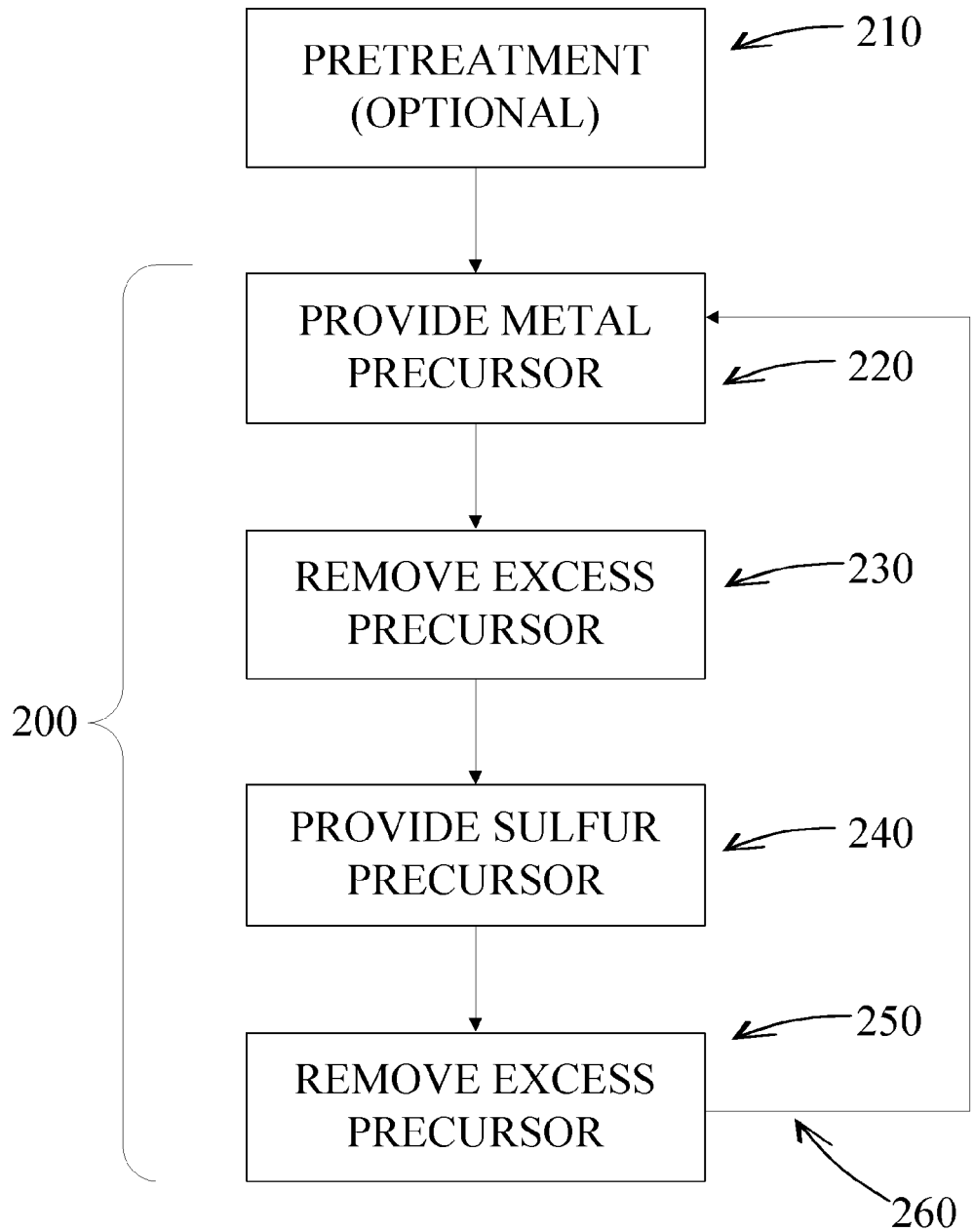
FIG. 2 is a flow chart illustrating an ALD process for forming a metal sulfide thin film according to some embodiments.

FIG. 2 illustrates that, according to some embodiments, a metal sulfide thin film is formed by an ALD-type process comprising multiple pulsing cycles 200, at least one cycle comprising:

pulsing a vaporized first metal precursor at step 220 into the reaction chamber to form at most a molecular monolayer of the metal precursor on the substrate, purging the reaction chamber at step 230 to remove excess metal precursor and reaction by products, if any, providing a pulse of a second sulfur precursor to contact the substrate at step 240, purging the reaction chamber at step 250 to remove excess second sulfur precursor and any gaseous by-products formed in the reaction between the metal precursor layer on the substrate and the second reactant, and repeating the pulsing and purging steps at step 260 until a metal sulfide thin film of the desired thickness has been formed.

Purging the reaction chamber may comprise the use of a purge gas and/or the application of a vacuum to the reaction space. Where a purge gas is used, the purge gas may flow continuously or may be flowed through the reaction space only after the flow of a reactant gas has been stopped and before the next reactant gas begins flowing through the reaction space. It is also possible to continuously flow a purge or non-reactive gas through the reaction chamber so as to utilize the non-reactive gas as a carrier gas for the various reactive species. Thus, in some embodiments, a gas, such as nitrogen, continuously flows through the reaction space while the metal and sulfur precursors are pulsed as necessary into the reaction chamber. Because the carrier gas is continuously flowing, removing excess reactant or reaction by-products is achieved by merely stopping the flow of reactant gas into the reaction space.

According to some embodiments, a metal sulfide thin film is formed by an ALD-type process comprising multiple pulsing cycles, each cycle comprising:

pulsing a vaporized first metal precursor into the reaction chamber to form at most a molecular monolayer of the metal precursor on the substrate, providing a pulse of a second sulfur precursor onto the substrate, repeating the pulsing steps until a magnesium sulfide thin film of the desired thickness has been formed.

In some embodiments, the ratio of metal precursor pulses to sulfur precursor pulses is adjusted. Thus, in some embodiments, a metal precursor is pulsed into the reaction chamber more than once relative to the pulse of the sulfur precursor in at least one cycle. And in some embodiments, the sulfur precursor is pulsed into the reaction chamber more than once relative to the pulse of the metal precursor in at least one cycle. For example, if increasing the amount of metal in the film is desired, at least one ALD cycle, every other ALD cycle, or every third, fourth, fifth, sixth cycle, etc. could include one or more additional metal precursor pulses. Similarly, if increasing the amount of sulfur in the film is desired, at least one ALD cycle, every other ALD cycle, or every third, fourth, fifth, sixth cycle, etc. could include one or more additional sulfur precursor pulses.

In some embodiments, it is desirable to incorporate at least two metals into the metal sulfide interface layer. Thus, in an appropriate ALD cycle, one or more cycles may include a pulse of a second, third, or fourth metal in addition to or in lieu of the first metal. For example, in some embodiments, the metal sulfide film comprises aluminum and magnesium. In some embodiments, the metal sulfide film comprises silicon and magnesium. In some embodiments, the metal sulfide film comprises hafnium and magnesium. For example, pulses of Al and Mg may be used in combination with sulfur precursor pulses to form AlMgS. Similarly, Si and Mg pulses or Si and Hf pulses may be used in combination with sulfur precursor pulses to form MgSiS or MgHfS, respectively. Without being tied to any particular, it is believed the use of more than one metal may achieve particular benefits, such as suppressed crystallization at elevated temperatures, minimized hygroscopic characteristics, and/or enhanced dielectric constants.

Referring again to FIG. 2, which illustrates an exemplary metal sulfide deposition process 200. Some embodiments may include a pretreatment process at step 201 applied to the substrate surface. A pretreatment may comprise one or more steps. In the pretreatment, the substrate surface on which the metal sulfide is to be deposited may be exposed to one or more pretreatment reactants and/or to specific conditions, such as temperature or pressure. A pretreatment may be used for any number of reasons including to clean the substrate surface, remove impurities, remove native oxide, and provide desirable surface terminations. In some embodiments, a pretreatment comprises exposing the substrate surface to one or more pretreatment reactant, such as $(NH_4)_2S$, $H_2S$, HCl, HBr, $Cl_2$, or HF. In some embodiments, a pretreatment process is carried out at about the same temperature as the subsequent deposition process. In some embodiments, a pretreatment process comprises one or more pulses of a suitable chemical, the pulses ranging from about 0.05 s to about 600 s, preferably from about 0.1 s to about 60 s. In some embodiments, the pressure during a pretreatment process is maintained between about 0.01 Torr and about 100 Torr, preferably from about 0.1 Torr to about 10 Torr.

In some embodiments, such as where a III-V material is used, HCl may be used as the pretreatment reactant. In some embodiments, such as where a germanium substrate is used, HF may be used as the pretreatment reactant. In some embodiments, multiple pretreatment reactants are used sequentially or simultaneously. In some embodiments, a pretreatment may involve multiple applications of one or more pretreatment reactants.

In some embodiments, a pretreatment may comprise first exposing the substrate surface to HCl for a period of time and then exposing the substrate surface to $H_2S$ for a period of time. Additional steps may also be included. For example, in some embodiments, water may be used to wash the substrate surface between the respective HCl and $H_2S$ exposures. Thus, in one possible pretreatment, a suitable substrate surface may be exposed to HCl for a period of between 1 s and 5 minutes, washed with deionized (DI) $H_2O$ twice for about a period of between about 1 s and 60 s, and exposed to two exposures of $H_2S$ for a period of about 1 s to about 60 s at. The preceding process may occur at any suitable temperature such as between about 100° C. and about 400° C.

According to some embodiments, a pretreatment may comprise an ex-situ wet clean treatment followed by one or more in-situ processes. The in-situ process may comprise multiple stages with different pretreatment reactants. For example, one in-situ sequence could comprise alternating exposure to HCl and $H_2S$ (HCl—$H_2S$—HCl—$H_2S$, etc.). Of course, it will be recognized that other combinations or other pretreatment reactants in similar or different combinations may also be used.

In some embodiments, the substrate surface is pretreated with a sulfur-containing compound. In some embodiments, the sulfur-containing compound may be the same as or different from the sulfur precursor used in a subsequent metal sulfide deposition process. According to some embodiments, a sulfur-containing pretreatment agent comprises a thiol with a general formula of R—S—H, wherein R can be an alkane, an alkene, or other carbon-containing group of atoms. In some embodiments, the sulfur-containing pretreatment reactant comprises plasma or radicals derived from S-containing species. In some embodiments, the pretreatment agent comprises elemental sulfur. The use of a pretreatment reactant comprising sulfur may provide —SH terminations on the substrate surface. In such situations, the subsequent exposure to a metal precursor, such as a magnesium precursor, will result in the immediate formation of Mg—S bonds and the beginning of a metal sulfide film, such as a MgS thin film. In some embodiments, a pretreatment is provided ex situ or in situ and may be provided as a liquid bath or by exposure to a vapor phase of a pretreatment reactant. In some embodiments, the pretreatment process comprises a sulfur passivation process.

In some embodiments, surface terminations other than S—H terminations may be desired. In such instances, it may be desirable to use a non-sulfur-containing pretreatment reactant. For example, in some embodiments, the pretreatment reactant may provide N—H terminations on the substrate surface. In some embodiments, such pretreatments could comprise an $NH_3$ anneal, $N_2$ plasma treatment, or exposure to $N_2H_4$, though other methods and other nitrogen-containing compounds may also be used. Similar to the result that may be achieved using sulfur-containing pretreatment reactants, the use of nitrogen-containing reactants may achieve N—H terminations on the substrate surface.

A pretreatment process may utilize pretreatment reactants in vapor form and or in liquid form. In some embodiments, the pretreatment process may be carried out at the same temperature and/or pressure as the subsequent deposition process. In some embodiments, the pretreatment process may resemble the subsequent deposition process except that the pretreatment process will involve a longer pulse time or exposure time than used in the subsequent deposition process.

In some specific embodiments, HCl may be used as the pretreatment chemical and may be used in liquid form and the HCl may diluted (e.g., 1 (37%): 10) and may be used in a 1 minute etch. In some specific embodiments, liquid $(NH_4)_2S$ having a concentration of 22% may be used in a 5 minutes dipping process to pretreat the substrate surface. In some embodiments, the duration of the pretreatment process can be varied broadly without affecting the film properties of the subsequently deposited films.

The pretreatment process may be performed at the same temperature and/or pressure as the subsequent ALD process; however, it may also be performed at a different temperature and/or pressure. In embodiments where the pretreatment is performed ex situ, it may be impossible or undesirable to perform the pretreatment at the same temperature and/or pressure as the subsequent ALD process. For example, where a pretreatment involves the immersion of the substrate in an aqueous solution, it may be desirable to allow the pretreatment to proceed at a higher pressure than the ALD process, which may be performed at relatively low pressures that could undesirably evaporate the pretreatment reactant.

Referring again to FIG. 2, a first metal reactant or precursor is conducted into the chamber at step 220 in the form of vapor phase pulse and contacted with the surface of the substrate. Conditions are preferably selected such that no more than about one monolayer of the precursor is adsorbed on the substrate surface in a self-limiting manner.

At step 230 excess first reactant and reaction byproducts, if any, are removed from the reaction chamber, often by purging with a pulse of inert gas such as nitrogen or argon. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10 seconds, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

At step 240 a second gaseous, reactant comprising sulfur (also referred to as a sulfur reactant or sulfur precursor) is pulsed into the chamber where it reacts with the first reactant bound to the surface. The reaction forms up to a monolayer of metal sulfide on the substrate surface.

At step 250, excess second reactant and gaseous by-products of the surface reaction, if any, are removed from of the reaction chamber, as described above for step 230. In some embodiments excess reactant and reaction byproducts are preferably removed with the aid of an inert gas.

The steps of pulsing and purging are repeated at step 260 until a thin film of the desired thickness has been formed on the substrate, with each cycle leaving no more than a molecular monolayer. In some cases, it might be desirable to achieve at least partial decomposition of at least one the various precursors.

Additional reactants can also be supplied that, in some embodiments, do not contribute elements to the growing film. Such reactants can be provided either in their own pulses or along with the metal and/or sulfur precursor pulses. The additional reactants can be used, for example, to provide a desired surface termination, or to strip or getter ligands from one or more of the reactants and/or free by-product.

In some embodiments, additional reactants are used in order to contribute additional species, such as oxygen or nitrogen, to the growing thin film. In some embodiments, the additional reactants may be provided in the same phase as another precursor, such as during the metal phase or the sulfur phase. In some embodiments, the additional reactant or reactants constitute their own phase or phases and are provided separate from both the metal and sulfur phases. Whether provided with another phase or separately, the additional reactant(s) may be provided in every cycle, some cycles, or only in one cycle in the deposition process.

In some embodiments, one or more additional non-metal elements may be desired in the metal sulfide film, such as nitrogen or oxygen. Additional phases can be incorporated in one or more deposition cycles, or provided after deposition of the metal sulfide film, in order to incorporate such materials. For example, in some embodiments one or more cycles may include a nitrogen phase in which the substrate is exposed to a nitrogen reactant. In some embodiments, the nitrogen phase incorporates at least some nitrogen into the metal sulfide thin film. In some embodiments, the nitrogen phase comprises exposing the substrate surface or growing film to $N_2$ plasma. In some embodiments, the nitrogen phase comprises subjecting the substrate surface or growing film to an annealing process using $NH_3$. In some embodiments, the nitrogen phase comprises subjecting the substrate surface or growing film to $N_2H_4$. In some embodiments, the nitrogen phase comprises exposing the substrate to nitrogen precursors, nitrogen radicals, atomic nitrogen, nitrogen plasma, or combinations thereof. A nitrogen phase can be included in one or more deposition cycles by providing a pulse of the nitrogen reactant and purging or after depositing some or all of the complete film. In some embodiments the nitrogen phase may follow the metal phase or the sulfur phase in one or more deposition cycles.

In some embodiments one or more cycles may include an oxygen phase in which the substrate is exposed to an oxygen reactant. In some embodiments, the oxygen phase incorporates at least some oxygen into the metal sulfide thin film. In some embodiments, the oxygen phase comprises exposing the substrate surface or growing film to oxygen plasma. In some embodiments, the oxygen phase comprises subjecting the substrate surface or growing film to an annealing process in an oxygen atmosphere. In some embodiments, the nitrogen phase comprises exposing the substrate to nitrogen precursors, nitrogen radicals, atomic oxygen, oxygen plasma, or combinations thereof. An oxygen phase can be included in one or more deposition cycles by providing a pulse of the oxygen reactant and purging or after depositing some or all of the complete film. In some embodiments the oxygen phase may follow the metal phase or the sulfur phase in one or more deposition cycles.

The metal sulfide thin films of the present disclosure can include any number of metals. Accordingly, suitable metal precursors comprising the desired metal of the metal sulfide can be selected. In some embodiments a metal sulfide comprising Mg, Ca, La, Sc, Y are formed. In other embodiments metal sulfides comprising Al, Si, Zn, Cd, Pb, In, Ga, Ge, Gd, Ta, Mo, or W are formed. Appropriate metal sulfides may include those that exhibit desirable characteristics, such as stability (e.g., does not reaction with substrate, capping layer, or air), high melting point (e.g., greater than about 1000° C., fewer charge trapping sites (e.g., $D_{it}$<5e11 1/cm$^2$), and a wide band gap (e.g., >3 eV).

According to some embodiments, a metal sulfide thin film includes two or more metals. In some embodiments, additional deposition phases are added to one or more deposition cycles to incorporate the additional metal or metals. The additional metal phase(s) may follow the first metal phase or follow the sulfur phase. In some embodiments two or more different metal precursors may be provided simultaneously in the same metal phase of a deposition cycle. In some embodiments metal precursors comprising different metals may be used in different deposition cycles. For example, a first metal precursor may be the only metal precursor used in one or more deposition cycles and a second metal precursor comprising a second, different metal, may be used in one or more other deposition cycles.

And in some films having two or more metals, additional non-metals other than sulfur, such as oxygen or nitrogen, may also be included. Again, additional deposition phases may be added to one or more deposition cycles to incorporate the additional materials. Accordingly, it is possible to achieve metal sulfide thin films with two or more metals, sulfur, and nitrogen or metal sulfide thin films with two or more metals, sulfur, and oxygen. Examples include, but are not limited to, MgHfOS, MgHfS, MgSiS, AlMgS, MgSO, and MgSN.

In some embodiments, the additional elements may already comprise a part of either the metal precursor or the sulfur precursor. For example, either the metal or sulfur precursor may include oxygen or nitrogen, which could serve as the additional desirable component in the resulting metal sulfide film. Where one or both of the metal and sulfur precursors also includes the additional element, it may be desirable to use that particular precursor in all or only some of the deposition cycles. For example, if the sulfur precursor includes the additional desirable element, such as oxygen, then that precursor could be used for only one or some of the deposition cycles while a different, non-oxygen-containing sulfur precursor is used for the remaining cycles.

In some such embodiments, the deposition may be performed as a two-step process, such as when forming a metal oxysulfide thin film. Thus, the first step may involve the formation of a metal sulfide film, and the second step may involve the formation or modification of the metal sulfide film into a metal oxysulfide film.

Similarly, a two-step process may be used to incorporate other materials, such as nitrogen, into the metal sulfide film. For example, the first step may involve the formation of a metal sulfide film, and the second step may involve the exposure of the metal sulfide film to a nitrogen precursor or a nitrogen-rich atmosphere so as to incorporate at least some nitrogen in to the film.

MgS has been chosen as an exemplary metal sulfide for the sake of this disclosure. In some embodiments, the magnesium precursor is provided first in an ALD cycle for forming MgS. After forming an initial surface termination, if necessary or desired, a first magnesium precursor pulse is supplied to the workpiece. In accordance with some embodiments, the first precursor pulse comprises a carrier gas flow and a volatile magnesium species that is reactive with the workpiece surfaces of interest. Exemplary magnesium precursors include magnesium beta-diketonates and cyclopentadienyl-based ("Cp") precursors, such as $MgCp_2$, which is desirable because of its high volatility and reactivity. Accordingly, the magnesium precursor adsorbs upon the workpiece surfaces. In some embodiments, the reaction is self-limiting such that the first precursor pulse self-saturates the workpiece surfaces such that any excess constituents of the first precursor pulse do not further react with the molecular layer formed by this process.

The first metal precursor pulse is preferably supplied in gaseous form. The metal precursor gas is considered "volatile" for purposes of the present description if the species exhibits sufficient vapor pressure under the process conditions to transport the species to the workpiece in sufficient concentration to saturate exposed surfaces.

In some embodiments the metal precursor pulse is from about 0.01 seconds to about 60 seconds, from about 0.02 seconds to about 30 seconds, from about 0.025 seconds to about 20 seconds, from about 0.05 seconds to about 5.0 seconds, about 0.05 seconds to about 2.0 seconds or about 0.1 seconds to about 1.0 second.

After sufficient time for a molecular layer to adsorb on the substrate surface, excess first precursor is then removed from the reaction space. In some embodiments the excess first precursor is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of oxygen gas, or another purge gas, that is flowing throughout the ALD cycle.

In some embodiments, the first precursor is removed from the reaction space, which may involve a purge gas that flows for about 0.05 to 20 seconds, more preferably between about 1 and 10 seconds, and still more preferably between about 1 and 2 seconds.

In the second phase, a sulfur precursor is provided to the reaction space. The adsorbed first reactant may then react with the sulfur precursor to form magnesium sulfide. In some embodiments the sulfur precursor pulse is from about 0.01 seconds to about 60 seconds, from about 0.02 seconds to about 30 seconds, from about 0.025 seconds to about 20 seconds, from about 0.05 seconds to about 5.0 seconds, about 0.05 seconds to about 2.0 seconds or about 0.1 seconds to about 1.0 second. However, depending on the reactor type, substrate type and its surface area, the sulfur precursor pulsing time may be even higher than 10 seconds. In some embodiments, pulsing times can be on the order of minutes. The optimum pulsing time can be readily determined by the skilled artisan based on the particular circumstances.

The concentration of the sulfur precursor in the reaction chamber may be from about 0.01% by volume to about 99.0% by volume. And the sulfur precursor may flow through the reaction chamber at a rate of between about 1 standard cm$^3$/min and about 4000 standard cm$^3$/min.

In some embodiments, the growth rate of the metal sulfide material is between about 0.01 Å/cycle and about 2.0 Å/cycle. In some embodiments, the growth rate is between about 0.1 Å/cycle and about 1.0 Å/cycle. In some embodiments, the growth rate is about 0.2 Å/cycle.

The metal sulfide ALD processes of the present disclosure comprise one or more cycles. Some embodiments involve the repetition of at least about 5 cycles, at least about 10 cycles, or at least about 50 cycles. In some embodiments, no more than 100 cycles are performed to form a thin film of a desirable thickness.

After a time period sufficient to completely react the previously adsorbed molecular layer with the sulfur precursor, for example the sulfur precursor pulse, any excess reactant and reaction byproducts are removed from the reaction space. As with the removal of the first reactant, this step may comprise stopping the flow of the sulfur precursor and continuing to flow a carrier gas, for a time period sufficient for excess reactive species and volatile reaction by-products to diffuse out of and be purged from the reaction space. In some embodiments a separate purge gas may be used. The purge may, in some embodiments, be from about 0.1 to about 10 s, about 0.1 to about 4 s or about 0.1 to about 0.5 s. Together, the sulfur precursor provision and removal represent a second phase in a metal sulfide ALD cycle, and can also be considered a sulfur or sulfide phase.

The two phases together represent one ALD cycle, which is repeated to form metal sulfide layers, such as magnesium sulfide layers. While the ALD cycle is generally referred to herein as beginning with the metal phase, it is contemplated that in other embodiments the cycle may begin with the sulfur phase. As mentioned above, providing a sulfur precursor first may also serve to pretreat the substrate surface. Thus, in some embodiments, the substrate is subjected to a pretreatment where the pretreatment reactant is the same as the sulfur precursor.

The metal precursor employed in the ALD type processes may be solid, liquid, or gaseous material under standard conditions (room temperature and atmospheric pressure), provided that the metal precursor is in vapor phase before it is conducted into the reaction chamber and contacted with the substrate surface.

In some embodiments, the sulfur precursor includes sulfur plasma or sulfur radicals. In such embodiments, the sulfur may be energized within the reaction chamber or upstream of the reaction chamber. Where a plasma is desired, the flow of un-energized sulfur precursor may comprise a type of purge gas, such that after the substrate has been exposed to a sulfur plasma for a desired period of time, the plasma generator may be turned off and the flow of sulfur precursor itself is used to clear the reaction chamber of excess sulfur plasma and unreacted byproducts.

While one skilled in the art will recognize that any number of suitable sulfur precursors may be used, appropriate sulfur precursors include sulfur-containing compounds that favorably react with the ligands or a previously or subsequently deposited metal precursor. Accordingly, selection of an appropriate sulfur precursor may depend on the specific metal precursor used and the nature of the ligands in the metal precursor. In some embodiments, the metal precursor is MgCp$_2$, and the sulfur precursor is either H$_2$S or (NH$_4$)$_2$S.

Before starting the deposition of the film, the substrate is typically heated to a suitable growth temperature, as discussed above. The preferred deposition temperature may vary depending on a number of factors, such as, and without limitation, the reactant precursors, the pressure, flow rate, the arrangement of the reactor, and the composition of the substrate including the nature of the material to be deposited on.

Figure 3:
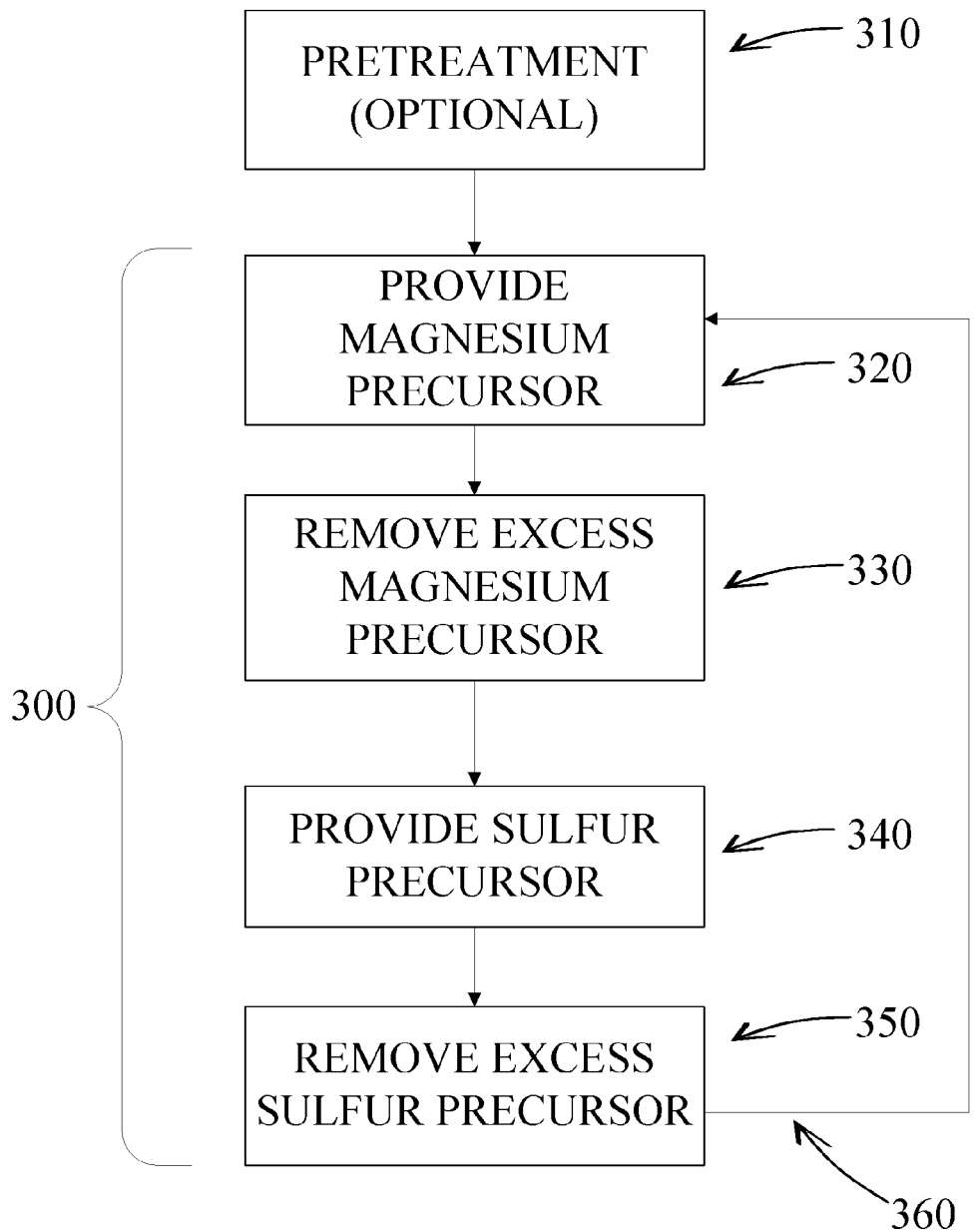
FIG. 3 is a flow chart illustrating an ALD process for forming a magnesium sulfide thin film according to some embodiments.

FIG. 3 illustrates an example of an ALD process for forming a magnesium sulfide thin film according to some embodiments of the present disclosure. A magnesium sulfide ALD process comprises multiple steps that may occur in the order shown or may be rearranged as explained in further detail below. According to some embodiments, a magnesium sulfide thin film is formed by an ALD-type process 300 comprising multiple pulsing cycles, each cycle comprising:

pulsing a vaporized first Mg precursor into the reaction chamber at step 320 to form at most a molecular monolayer of the Mg precursor on the substrate, purging the reaction chamber at step 330 to remove excess Mg precursor and reaction by products, if any, providing a pulse of a second sulfur precursor onto the substrate at step 340, purging the reaction chamber at step 350 to remove excess second reactant and any gaseous by-products formed in the reaction between the Mg precursor layer on the first surface of the substrate and the second reactant, and repeating at step 360 the pulsing and purging steps until a magnesium sulfide thin film of the desired thickness has been formed.

According to some embodiments, ALD process 300 may be preceded by a pretreatment of the substrate at step 310. In some embodiments, the pretreatment reactant may comprise sulfur, and in some embodiments, the sulfur-containing pretreatment reactant may be the same as the sulfur precursor utilized in step 340.

According to some embodiments, the metal sulfide film comprises at least some oxygen. Such oxygen may be present because at least one of the precursors contains oxygen or because of a compound used with the precursor contains oxygen, such as $H_2O$ in an aqueous solution of ammonium sulfide. However, in some embodiments, the presence of oxygen is undesirable. Hence, the amount of oxygen in the thin film will be kept to a minimum or will not be present in any appreciable amount. And, in some embodiments, precursors having no or essentially no oxygen are utilized.

A capping layer may be desirable in some embodiments, for example because some metal sulfide thin films are hygroscopic. Thus, according to some embodiments, a capping layer is deposited or formed on top of the metal sulfide thin film. In some embodiments, a subsequently deposited or formed dielectric layer serves as a capping layer. In some embodiments the capping layer may protect the thin film during transport of the substrate.

In some embodiments, the metal sulfide thin film is subjected to a post deposition treatment process. In some embodiments, the post treatment process is used subsequent to forming a dielectric layer above the interface layer. However, in some embodiments, a pretreatment is carried out prior to any subsequent deposition, such as the deposition of a capping layer. In some embodiments, a post deposition treatment process includes, for example, at least one of an annealing process, a forming gas annealing process, and a sulfur passivation process. A sulfur passivation process may remove at least some unbound or undesirable carbon that may be present in the metal sulfide thin film or the capping layer (e.g., the dielectric layer) on top of the metal sulfide thin film. $H_2S$ may be used in a suitable sulfur passivation process as described in greater detail below.

Metal Precursors

It will be understood by one skilled in the art that the metal of the metal sulfide thin films of the present disclosure may be selected from any number of options. In some embodiments, the metal precursor is selected from compounds containing Be, Mg, Ca, Ba, Sr, Y, Sc, La and other lanthanides (i.e., Ce, Pr, Nd, Pm, Sm, Eu, Gd, Tb, Dy, Ho, Er, Tm, Yb, and Lu). In some embodiments, the metal precursor is selected from compounds containing Al, Si, Zn, Cd, Pb, In, Ga, Ge, Gd, Ta, Mo, or W. In some embodiments, the metal precursor comprises one or more ligands, such as cyclopentadienyl ("Cp") ligands. $MgCp_2$ is one example of a suitable metal precursor. In some embodiments, the metal precursor is a metal beta-diketonate. In some embodiments, the metal precursor is not a cyclopentadienyl-compound of Ba or Sr. In some embodiments, the metal precursor is not a cyclopentadienyl-compound of Ce or Mn.

In some embodiments, the metal precursor has the following formula:

$$ML_2A_x \quad (I)$$

wherein each L can be independently selected to be a hydrocarbon group and M can be is Be, Mg, Ca, Ba or Sr and A can be neutral ligand or adduct, such as ethylenediamine or EtOH, and x can be from 0 to 2. Preferably L can be linear, branched, cyclic alkyl or unsaturated hydrocarbon group, such as alkenyl, alkynyl, aromatic, cyclopentadienyl, phenyl, cyclooctadienyl, or cycloheptatrienyl group. Preferably M is Mg or Ca. Preferably x is 0. More preferably L is cyclopentadienyl group. More preferably M is Mg. In some embodiments, the L can be a bidentate ligand, such as betadiketonate, guanidinate or amidinate. In some embodiments, the betadiketonate ligand can be acetylacetonate or 2,2,6,6-tetramethyl-3,5-heptanedionato (thd).

In some embodiments, the metal precursor is a cyclopentadienyl compound or derivated thereof, such as alkylsubstituted cyclopentadienyl compound and have the following formula:

$$M(R_1R_2R_3R_4R_5Cp)_2 \quad (II)$$

wherein each of the $R_1$-$R_5$ can be independently selected to be hydrogen or substituted or unsubstituted alkyl group and M can be is Be, Mg, Ca, Ba or Sr. In preferred embodiments the M is Mg and each of the $R_1$-$R_5$ can be independently selected to be $R_1$-$R_5$ can be hydrogen or linear or branched $C_1$-$C_5$ alkyl group. In more preferred embodiments the M is Mg and each of the $R_1$-$R_5$ can be independently selected to be hydrogen or $C_1$-$C_3$ alkyl group, such as methyl, ethyl, n-propyl or i-propyl group. In most preferred embodiment the precursor is Mg$(Cp)_2$.

In preferred embodiments, the metal M in formulas is Mg, Ca, Sc, Y or La. In more preferred embodiments, the metal in the formula is Mg.

In some embodiments, the metal precursor comprises one or more ligands, such as cyclopentadienyl ("Cp") ligands. These source compounds can be selected from a group consisting of the following compounds:

$$(Cp)_xM \quad (III);$$

$$(Cp)_xL_yM \quad (IV);$$

$$(Cp)_xW_nM \quad (V);$$

$$(CP)_xL_yW_nM \quad (VI);$$

wherein M is Sc, Y, La, Ce, Pr, Nd, Sm, Eu, Gd, Tb, Dy, Ho, Er, Tm, Yb or Lu;

Cp is a cyclopentadienyl or a cyclooctadienyl group, so that Cp groups in chemical formulas I—IV can be the same with each other or different from one other; x denotes the number of the Cp ligands and it is an integer from 1 up to the oxidation state of M;

$L_y$ is a neutral adduct ligand that bounds from one or more of its atoms to the rare earth metal and where y denotes the number of the bound ligands; and W is some other ligand with a valence of −1 than Cp and where n denotes the number of the ligands. W is preferably beta-diketonate or its corresponding sulfur or nitrogen compound, halide, amide, alkokside, carboxylate or Schiff's base. It must be noted that cyclooctadiene is usually shortened as Cod, but here the presentation is simplified by the use of the single common abbreviation Cp for both cyclopentadienyl and cyclooctadienyl.

In the chemical equations I-IV, the cyclopentadienyl and/or cyclooctadienyl groups can be in the same molecule, so that there is a bridge between two Cp-groups consisting of a substituted or unsubstituted $C_1$-$C_6$ chain that may contain a heteroatom selected from Si, N, P, Se, S or B.

L is preferably
(i) a hydrocarbon,
(ii) a hydrocarbon that contains oxygen,
(iii) a hydrocarbon that contains nitrogen, (iv) a hydrocarbon that contains sulfur,
(v) a hydrocarbon that contains phosphor,
(vi) a hydrocarbon that contains arsenic,
(vii) a hydrocarbon that contains selenium and/or
(viii) a hydrocarbon that contains tellurium
L is more preferably
(a) amine or polyamine,
(b) bipyridine,
(c) a ligand according to a chemical equation

wherein G is —O—, —S—, or —NR', where $R^1$ is hydrogen or substituted or unsubstituted, cyclic, linear or branched, alkyl, alkenyl, aryl, alkylaryl, arylalkyl, alkoxy, thio, cyano or silyl group. A cyclic or aromatic ring in $R^1$ may contain a heteroatom. Hydrogen or $R^1$-type substituent may also be attached to the carbon atoms in chemical equation V, or
(d) ether or thioether.

Cyclopentadienyl or cyclooctadienyl group Cp in chemical formulas I-IV has a form:

$$Cp'R_mH_{a-m} \quad (VII)$$

wherein m is an integer 0-8, when a is 8 and m is an integer 0-5 when a is 5,
Cp' is fusioned or isolated cyclopentadienyl or cyclooctadienyl and
R is a hydrocarbon fragment continuing 1-20 carbon atoms, preferably $C_1$-$C_6$ hydrocarbon.

R ligands can be the same with each other or different from one other. R can be a substituted or unsubstituted, cyclic, linear or branched, alkyl alkenyl, aryl, alkylaryl, arylalkyl, alkoxy, tbio, amino, cyano or silyl group. The cyclic or aromatic ring of the substituent may contain a hetero atom. Examples of the substituents are methyl, ethyl, propyl and isopropyl groups.

Neutral adduct ligands L shown in chemical equations II and IV can be ethers, amines or solvent molecules such as tetrahydrofurane that form a bond to the metal with one atom. Examples of suitable neutral adduct ligands that form a bond to a metal with several atoms are polyethers and polyamines.

In some embodiments, it is desirable to have the metal in the metal sulfide thin film be the same as the metal in a dielectric layer that is to be deposited over the metal sulfide layer. Thus, in some embodiments, a metal precursor is selected that has the same metal. In some embodiments the precursor may be the same precursor that is used in a subsequent process to deposit a dielectric layer, such as a metal oxide. In this vein, in some embodiments, the metal is selected from metal oxides that are desirable dielectric or high-k materials, such as MgO, $SrTiO_x$, and $BaTiO_x$.

Where a specific metal oxide is known to serve as a suitable or good dielectric material, the metal precursor used to form the metal oxide may be used in the presently disclosed methods to form a desirable metal sulfide interfacial layer.

In some embodiments, the metal precursor does not comprise cesium. However, cesium may comprise a component of the metal precursor in other embodiments. In some embodiments, the metal precursor does not comprise strontium and/or barium. However, strontium and/or barium may comprise a component of the metal precursor in other embodiments. In some embodiments, the metal precursor does not comprise calcium.

In some embodiments, the metal precursor is selected such that the metal of the metal precursor is distinct from any metal that may be present in the underlying substrate. For example, the metal precursor may be selected so as to provide a metal that is distinct from a metal in an underlying high-mobility channel. Thus, in some embodiments, the metal precursor specifically does not comprise Ga, As, In, Sb, etc. depending on the type of high-mobility channel or underlying substrate that is used. Similarly, in some embodiments, the metal precursor is selected such that the metal of the metal precursor is distinct from any metal that may be present in the high-k material or dielectric layer formed above the interfacial layer. However, in some embodiments, the metal of the metal precursor may also be found in one or both the underlying high-mobility channel and the overlying high-k material or dielectric layer.

According to some embodiments where the formation of a metal oxysulfide or metal oxysulfate thin film is desired, suitable metal precursors can include, for example, compounds containing Mg, Al, In, Ga, Ge, and Gd.

Sulfur Precursors

It will be understood by one skilled in the art that any number of sulfur precursors may be used. In some embodiments, the sulfur precursor is selected from the following list: $H_2S$, $(NH_4)_2S$, dimethylsulfoxide $((CH_3)_2SO)$, elemental or atomic S, other precursor containing S—H bond, such as $H_2S_2$ or such as thiols R—S—H, wherein R can be substituted or unsubstituted hydrocarbon, preferably $C_1$-$C_8$ alkyl group, more linear or branched preferably $C_1$-$C_5$ alkyl group. Suitable sulfur precursors may include any number of sulfur-containing compounds so long as they include at least one S—H bond. In some embodiments, the sulfur precursor may comprise a sulfur plasma or sulfur radicals. In some embodiments where energized sulfur is desired, a plasma may be generated in the reaction chamber or upstream of the reaction chamber.

In some embodiments where $(NH_4)_2S$ is employed, the $(NH_4)_2S$ may be provided in an aqueous solution. In such embodiments, it may be desirable to provide the sulfur precursor in shorter pulses so as to reduce the effects that $H_2O$ vapor from the solution may have on the substrate or film growth. However, in some embodiments, the sulfur precursor itself may comprise oxygen.

According to some embodiments, it is desirable to use an oxysulfide—generically described as $O_xS_y$—or an oxysulfate—generically described as $O_x(SO_4)_y$. In some embodiments, an aqueous solution of $SO_x$, such as $SO_4$, may be used as the sulfur precursor.

Integration

The metal sulfide thin films of the present disclosure may be used in a variety of semiconductor applications. For example, metal sulfide films may be particularly useful in high-mobility channel applications, such as where III-V materials or germanium substrates are used. High-mobility channels are generally desirable in high-speed applications or high-switching applications. Metal sulfide films may be used, for example, in FinFETs, planar transistors, MOSFETs, capacitors, vertical nanowires, and power transistors.

Figure 4:
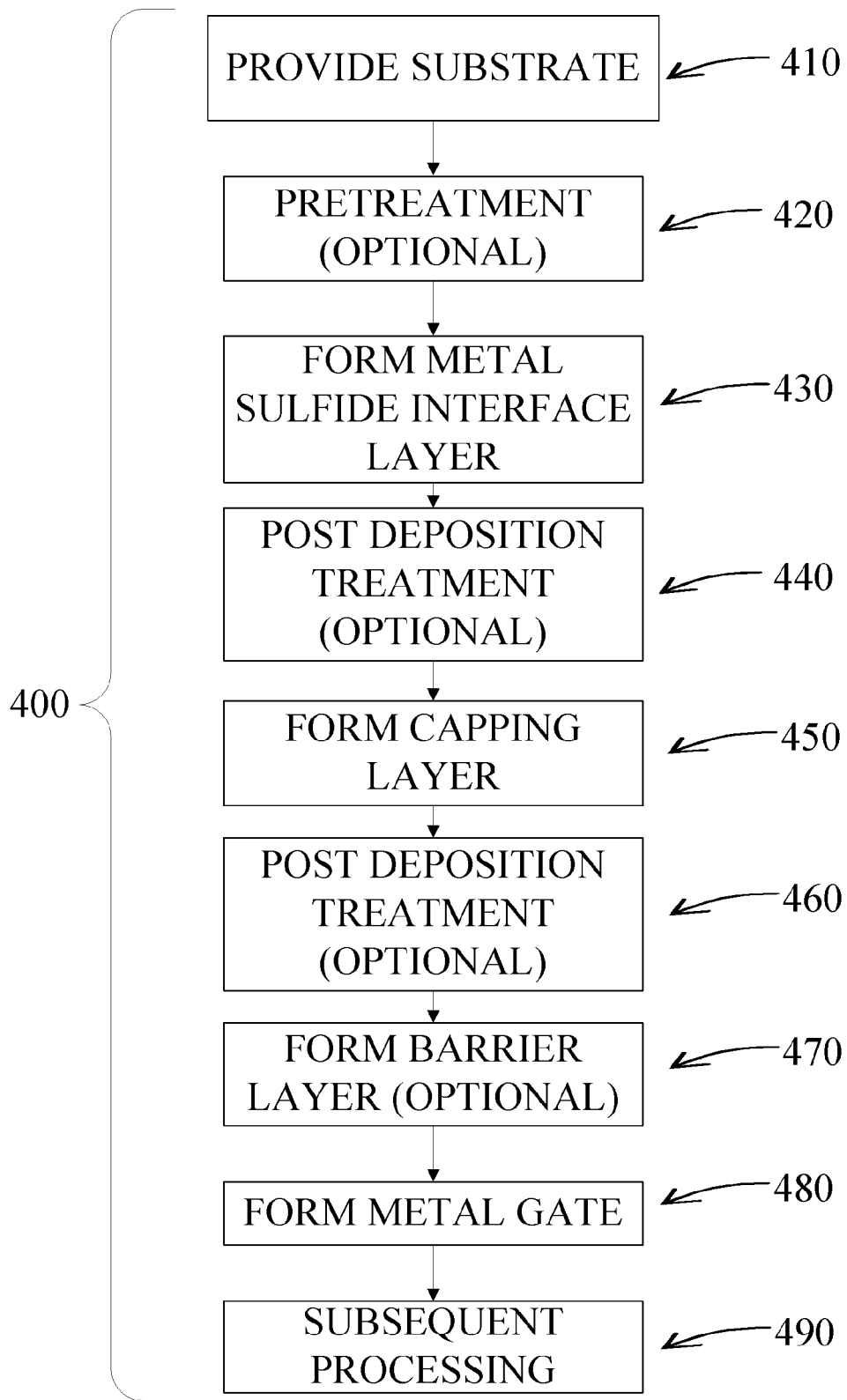
FIG. 4 illustrates an exemplary process for forming a three-dimensional architecture according to the present disclosure.

FIG. 4 illustrates an exemplary process flow 400 for the formation of a three-dimensional structure, such as a gate stack, capacitor, etc. In some embodiments, the formation of a suitable semiconductor structure proceeds as follows:

A suitable substrate, such as one having a high-mobility channel (e.g., InGaAs), is provided at step 410;

The substrate is optionally subjected to a pretreatment process either ex situ or in situ at step 420;

A suitable metal sulfide thin film is formed on a surface of the substrate, such as by an ALD process, at step 430;

A capping layer (e.g., a dielectric, such as a high-K dielectric like $Al_2O_3$ or $HfO_2$) is formed over the metal sulfide thin film at step 450;

The substrate is optionally subjected to a post deposition treatment process, either before or after formation of the capping layer, at step 460;

Optionally, a barrier layer, such as TiN, is formed at step 470 over the capping layer by a process such as an ALD process;

A metal gate is then formed at step 480 on top of the previously formed layers; and Any further layers or materials as desired are formed on top of the metal gate in subsequent processing steps at step 490.

According to some embodiments, the substrate surface provided at step 410 will include a high-mobility channel. Exemplary high-mobility channels include those composed of InGaAs and similar III-V materials. The substrate surface may have been subject to prior processing before being provided for the metal sulfide film integration process 400. For example the substrate may have been subjected to a doping process to form a source or a drain or both.

According to some embodiments, process 400 will be used to form a three-dimensional architecture, such as a transistor, a FinFET, vertical nanowire transistors, a planar transistor, a capacitor, a power transistor, etc. A substrate is provided in step 400. In some embodiments the substrate is placed into a reaction space that is part of a deposition reactor, such as an ALD reactor, where the metal sulfide interface film will be deposited. In some embodiments the substrate is provided to a tool for a pretreatment process 420 and subsequently provided to a deposition reactor.

FIG. 4 illustrates an optional pretreatment at step 420. A pretreatment may be used for any number of reasons including to clean the substrate surface, remove impurities, remove native oxide, and/or provide desirable surface terminations. In some embodiments, the pretreatment reactant comprises any suitable reducing chemistry. In some embodiments, a pretreatment comprises exposing the substrate surface to pretreatment reactant, which may comprise, for example, $(NH_4)_2S$, $H_2S$, HCl, or HF. The appropriate pretreatment reactant may be selected by the skilled artisan based on the particular circumstances and desired effect.

In some embodiments, such as where the substrate comprises a III-V material, HCl may be used as the pretreatment reactant. An HCl dip may remove the surface contaminants, such as hydrocarbons, particles and metals, but not fully remove the native oxide. HCl concentration may vary, but not limited, from to concentrated about 37 weight-% to dilute 1 weight-%.

In some embodiments, such as where a germanium substrate is used, HF may be used as the pretreatment reactant. HF dip may remove the surface contaminants, such as hydrocarbons, particles and metals, but not fully remove the native oxide. HCl concentration may vary, but not limited, from to concentrated about 50 weight-% to dilute 0.1 weight-%.

In some embodiments, a pretreatment process will utilize both HCl and HF. For example, a substrate surface may be exposed first to an HCl solution and then to an HF solution or vice versa. In some embodiments, the pretreatment process comprises a sulfur passivation process. In some embodiments the substrate is exposed to a pretreatment reactant comprising sulfur. The use of a pretreatment reactant comprising sulfur may provide —SH terminations on the substrate surface. In such situations, the subsequent exposure to a metal precursor in the beginning of step 430, such as a magnesium precursor, will result in the immediate formation of metal-sulfur bonds and the beginning of the metal sulfide interface layer. In some embodiments, a pretreatment process may comprise the substrate surface being exposed to $H_2S$.

In some embodiments, surface terminations other than —SH terminations may be desired. In such instances, it may be desirable to use a non-sulfur-containing pretreatment reactant, such as the HF or HCl exposure described above. According to some embodiments, HCl and/or HF may be applied in-situ or in a clustered configuration.

Pretreatment 420 may comprise exposure to a liquid reactant, such as by submerging the substrate in a liquid bath or by exposing the substrate to a vapor phase pretreatment reactant. In some cases in-situ HCl or HF pretreatment from gas phase is done without airbreak or exposure to air. In some cases in-situ $H_2S$ pretreatment from gas phase is done without airbreak or exposure to air.

In some embodiments, pretreatment may comprise changing the temperature and atmosphere, such as hydrogen plasma treatment, $NF_3$ plasma treatment, or thermal $H_2$ bake.

Subsequent to the pretreatment step, if performed, a metal sulfide interface layer is formed 430. In some embodiments, a suitable interface layer is one that comprises a metal sulfide. Suitable metal sulfides includes those where the metal is selected from the following: Be, Mg, Ca, Ba, Sr, Y, Sc, La and other lanthanides (i.e., Ce, Pr, Nd, Pm, Sm, Eu, Gd, Tb, Dy, Ho, Er, Tm, Yb, and Lu), Al, Si, Zn, Cd, Pb, In, Ga, Ge, Gd, Ta, Mo, and W. In some embodiments, suitable metal sulfides includes those where the metal is not selected from the following: Al, Ga, or In. In some embodiments, it is desirable that the metal of the metal sulfide film be distinct from the metal of either or both the underlying substrate surface and an overlying layer, such as a subsequently formed capping layer or dielectric layer. In some embodiments, the interface layer is deposited to be a distinct layer from the substrate meaning that no material from the substrate is consumed for the interface layer, except that some bonds may form between the substrate and the interface layer.

In some embodiments, the metal sulfide thin film is deposited to achieve a particular thickness. Suitable thicknesses may be greater than or equal to about 1 Å and less than or equal to about 50 Å. In some embodiments, the thickness will be between about 5 Å and about 30 Å. In some embodiments, the thickness will be between about 5 Å and about 15 Å or 10 Å. In some embodiments, the thickness is between about 1 Å and about 5 Å. In to some embodiments, the suitable thickness will be one that achieves a complete layer over the substrate surface (i.e., one that leaves no gaps). Accordingly, the actual thickness that achieves a complete layer may depend on the type of metal sulfide formed and the types of precursors used to achieve the metal sulfide.

In some embodiments, suitable metal sulfide materials include one or more of the following: beryllium sulfide (BeS), magnesium sulfide (MgS), calcium sulfide (CaS), barium sulfide (BaS), strontium sulfide (SrS), yttrium sulfide ($Y_2S_3$), lead sulfide (PbS), indium sulfide ($In_2S_3$), gallium sulfide ($Ga_2S_3$), aluminum sulfide ($Al_2S_3$), silicon sulfide ($SiS_2$), zinc sulfide (ZnS), cadmium sulfide (CdS), germanium sulfide ($GeS_2$), tantalum sulfide ($TaS_2$), molybdenum sulfide ($MoS_2$), lanthanum sulfide (LaS) and other sulfides of lanthanides (such as gadolinium sulfide ($Gd_2S_3$)), tungsten sulfide ($WS_2$), hafnium sulfide ($HfS_x$), zirconium sulfide ($ZrS_x$), titanium sulfide ($TiS_x$), and mixtures thereof. Other metal sulfides are also possible. For simplicity, these metal sulfides have been indicated to have these general stoichiometries.

But it will be understood that the exact stoichiometry of any given metal sulfide will vary based on the oxidation state of the metal. Accordingly, other stoichiometries are expressly contemplated.

In some embodiments the metal sulfide interface layer comprises $Al_2S$, $SiS_2$, $ZnS$, $CdS$, $SrS$, $CaS$, $BaS$, $PbS$, $In_2S_3$, $Ga_2S_3$, $GeS_2$, $Gd_2S_3$, $TaS_2$, $MoS_2$ or $WS_2$. In some embodiments the metal sulfide interface layer is a $MgS_x$ layer. In some embodiments, the metal sulfide further comprises oxygen and nitrogen as well as optionally additional metals, such as in MgHfOS, MgHfS, MgSiS, AlMgS, MgSO, and MgSN.

In some embodiments, the deposited metal sulfide interface comprises at least about 5 at-% of sulfur, preferably more than about 15 at-% of sulfur and more preferably more than about 30 at-% of sulfur and most preferably more than about 40 at-% of sulfur. Depending on the metal oxidation state the metal sulfide interface may comprise sulfur from about 45 at-% to about 75 at-%.

In some embodiments, the metal sulfide interlayer is formed by an ALD process as described above. In some embodiments, the metal sulfide is formed by a CVD process. CVD-like processes or a combination of ALD and CVD processes may also be used. In some embodiments, other processes, such as PVD, PEALD, etc. may be used.

In some embodiments the metal sulfide interface layer can be subjected to a post-deposition treatment 440 prior to formation of a capping layer 450. For example, once a desired thickness of the metal sulfide layer 430 is achieved, a sulfur passivation process (or other suitable post deposition treatment, such as an annealing process or a forming gas annealing process) may be carried out, after which a capping layer may be formed over the treated interface layer.

Subsequent to any post deposition treatment processing, a capping layer may be formed over the metal sulfide interface layer. A capping layer may be desirable in some embodiments, for example because some metal sulfide thin films are hygroscopic. Thus, according to some embodiments, a capping layer is deposited or formed on top of the metal sulfide thin film. In some embodiments, a subsequently deposited or formed dielectric layer serves as a capping layer. In some embodiments the capping layer may protect the thin film during transport of the substrate.

In some embodiments the capping layer 450 may be a dielectric layer. In some embodiments the capping layer is deposited and a separate dielectric layer is deposited over the capping layer, where the dielectric layer comprises a different material from the capping layer. For example, in some embodiments, a capping layer comprising a metal sulfide or metal oxysulfide having a different metal from the one used in interface layer 430 is deposited over interface layer 430 prior to depositing a dielectric or high-k material.

The capping layer formed at step 450 may comprise a dielectric layer. Generally, the dielectric layer includes a high-k material, such as aluminum oxide, tantalum oxide, hafnium oxide, or titanium oxide. In some embodiments, the capping layer may comprise a non-high-k material. As with the interface layer, the capping layer may be formed by ALD processes, CVD process, etc. The capping layer may have a thickness of from about 5 Å to about 200 Å, preferably from about 7 Å to about 100 Å, more preferably from about 10 Å to about 80 Å. The specific material and thickness can be selected by the skilled artisan based on the particular circumstances, including the specific type of structure being formed.

In some embodiments, if the device has to have a high breakdown voltage, like in the case of power devices, the dielectric capping layer may have a thickness up to 100 nm to achieve desired properties.

A post-deposition treatment step 460 may be performed after the formation of the capping layer at step 450. In some embodiments, the post deposition treatment may precede the formation of a capping layer. In some embodiments where the capping layer is not a dielectric layer, a post deposition treatment may be applied after the formation of the capping layer but before the formation of a dielectric layer. In other embodiments the post deposition treatment step may be carried out after formation of a dielectric layer.

Similar to the pretreatment optionally applied at step 420, the post deposition treatment may involve the exposing the previously formed layers to specific conditions and/or reactants in order to improve the properties of the deposited films. For example, a post deposition treatment step may serve to remove unreacted reactants or reaction by-products, and/or to remove undesirable impurities from the deposited layer or layers. The post deposition treatment step may also change the physical properties of the deposited layers. In some embodiments, a post deposition treatment process may include, for example, an annealing process, for example annealing in a forming gas atmosphere, or a passivation process. The passivation may remove at least some unbound or undesirable carbon that may be present in the metal sulfide thin film or the capping layer (e.g., the dielectric layer) on top of the metal sulfide thin film.

A suitable post deposition treatment may involve an anneal in a specific atmosphere performed at temperatures from about 300° C. to about 800° C., pressures from about 0.1 Torr to about 760 Torr, and a forming gas $N_2/H_2$ or $N_2$ atmosphere. According to some embodiments, the use of a post deposition process may incorporate additional elements in the deposited materials. For example, in some embodiments, the use of a post deposition treatment involving a nitrogen precursor may result in the incorporation of nitrogen into the either or both the metal sulfide thin film and the capping layer. Similarly the use of a post deposition process involving oxygen may result in the incorporation of at least some oxygen into the metal sulfide thin film.

Following any post deposition treatment, an optional barrier layer may be formed 470. Suitable materials for a barrier layer may include elemental metal, metal nitrides, silicon-doped metal nitrides, metal boron carbides, metal aluminum carbides, metal aluminum silicon carbides, metal boron silicon carbides, carbides, and carbonitrides of various metals, such as titanium, tantalum, etc., and mixtures thereof. Suitable examples include SiN, TaCN, TiSiN, and TaSiN. In the case of metal carbides, suitable metals include Ti, Zr, Hf, V, Nb, Ta, Cr, Mo, and W with Ti or Ta being the most preferable options in some embodiments. In some embodiments the barrier layer might also be an oxide, such as $Al_2O_3$, MgO or $La_2O_3$, which can help in tuning the properties of the device, such as the effective work function of the metal gate in the device. As with the previous layers, the barrier layer may be formed by ALD processes, CVD process, etc.

At step 480, a gate is formed. In some embodiments the gate is a metal gate. The gate may be formed by any process known in the art, such as by an ALD process, a CVD process, etc. The metal gate may comprise any number of materials, such as TiN, TiC, TiAlC, TaC, TaAlC, NbAlC, TiAl, Al, TaAl, Ta, TaN, TaCN, W, WN, TiWN, and Co. In some embodiments, suitable metals for use in the metal gate materials include Ti, Zr, Hf, V, Nb, Ta, Cr, Mo, and W and nitrides, silicon-doped nitrides, boron carbides, aluminum carbides, aluminum silicon carbides, boron silicon carbides, carbides, and carbonitrides of those metals.

In some embodiments, a process such as the one outlined above, is performed in situ or in a cluster tool. In some embodiments, only the metal sulfide formation and capping layer formation are performed in situ. In some cases, the presence of the capping layer allows for the substrate to be more easily transferred between tools.

In some embodiments, subsequent processing may occur after the formation of the metal gate. For example, additional layers may be formed or patterning of the deposited layers may occur. In some embodiments, the process is used to form a three dimensional structure, such as a fin in a FinFET device Example 1

A number of metal sulfide films were formed using an ALD process in which process conditions were varied. The metal chosen for the metal sulfide was magnesium and precursor was $Mg(Cp)_2$, and the sulfur precursor was $(NH_4)_2S$ extracted from a bubbler containing $(NH_4)_2S$ solution in water. The metal and sulfide reactants or precursors were pulsed through a reaction space in an ALD process with pulse times ranging from 40 ms to 50 ms. Growth rates varied between about 0.2 Å/cycle and about 0.5 Å/cycle were observed with the faster growth rates occurring initially and the growth rate slowing to a steady 0.2 Å/cycle. The reaction temperature was varied from about 250° C. to about 300° C.

The resulting films were analyzed using XRR analysis, which determined a MgS density of about 2.6 g/cm$^3$. This is within the range of bulk MgS density (2.6-2.8 g/cm$^3$). It was also determined by XRD analysis that a pulsing time for the sulfur precursor of about 50 ms achieved an MgS-dominated film and that a pulsing time of about 1000 ms achieved a MgO-dominated film. Almost pure films of MgS formed at very short exposure (pulse) times. As the exposure (pulse) time was increased, oxygen was incorporated into the film forming $MgS_xO_{1-x}$ to the limit for very long exposure (pulse) times where the film is almost pure MgO.

Based on the results of this experiment, it was determined that suitable reaction condition would include the following: reaction temperature from about room temperature (e.g., 18° C.) to about 400° C., more preferably from about 50° C. to about 375° C., and most preferably from about 100° C. to about 350° C.; pulse time of between about 0.025 seconds to about 60 seconds; pressure ranging from about 0.5 Torr to about atmospheric pressure (i.e., 760 Torr); and a sulfur precursor provided in either vapor or liquid form.

Example 2

A number of metal sulfide films were formed using an ALD process in which process conditions were varied. Prior to film formation, the substrates were subjected to a pretreatment process comprising exposure to HCl and $H_2S$. The metal chosen for the metal sulfide was magnesium, and the precursor was $Mg(Cp)_2$, and the sulfur precursor was $H_2S$. The metal and sulfide reactants or precursors were pulsed through a reaction space in an ALD process with pulse times ranging from about 50 ms to about 3 s. Growth rates varied between about 0.2 Å/cycle and about 0.5 Å/cycle with the faster growth rates occurring initially and the growth rate slowing to a steady 0.2 Å/cycle. The reaction temperature was about 250° C. After deposition was complete, the films were subjected to a post deposition treatment comprising exposure to gas mixture of $N_2$ and $H_2$ at 400° C. The resulting films were analyzed using XRR analysis, which determined a MgS density of about 2.6 g/cm$^3$. This is within the range of bulk MgS density (2.6-2.8 g/cm$^3$). It was also determined by XRD analysis that the film is MgS-dominated. RBS showed the stoichiometry Mg:S=1:1.

Based on the results of this experiment, it was determined that suitable reaction condition would include the following: reaction temperature from about room temperature (e.g., 18° C.) to about 400° C., more preferably from about 50° C. to about 375° C. and most preferably from about 100° C. to about 350° C., pulse time of between about 0.025 seconds to about 60 seconds, pressure ranging from about 0.5 Torr to about atmospheric pressure (i.e., 760 Torr).

Example 3

In this example, a comparison was made between two metal oxide semiconductor capacitors (MOSCAPs) formed on respective InGaAs substrates. A first MOSCAP was formed with an $Al_2O_3$ interface layer, and a second MOSCAP was formed with an MgS interface layer formed according to the present disclosure in which $Mg(Cp)_2$ served as the metal precursor, and $H_2S$ served as the sulfur precursor. The respective features and results obtained are contained in Table 1 below.

TABLE 1

Comparison of physical properties using MgS vs. $Al_2O_3$ interfacial layers.

| Metric | Benchmark Layer | MgS Interface Layer |
|---|---|---|
| Structure | Pt gated MOSCAP on $In_{0.53}Ga_{0.47}As$ | Pt gated MOSCAP on $In_{0.53}Ga_{0.47}As$ |
| Ex-situ pretreatment | HCl wet clean | HCl wet clean |
| In-situ pretreatment | $H_2S$ | $H_2S$ |
| Interface Layer | — | MgS deposited with 11 cycles to achieve a thickness between ~10 Å and ~15 Å |
| High-k Layer | 10 Å $Al_2O_3$ and 30 Å of $HfO_2$ | 10 Å $Al_2O_3$ and 30 Å of $HfO_2$ |
| Post high-k treatment | $H_2/N_2$ annealing at 400° C. | $H_2/N_2$ annealing at 400° C. |
| CET | 1.6 nm | 2.3 nm |
| Dit at midgap (eV–1cm–2) | ~1.4E12 | <4E11 |
| Dispersion at 1 V (%/dec) | 4.5 | 0.8 |

Figure 5:
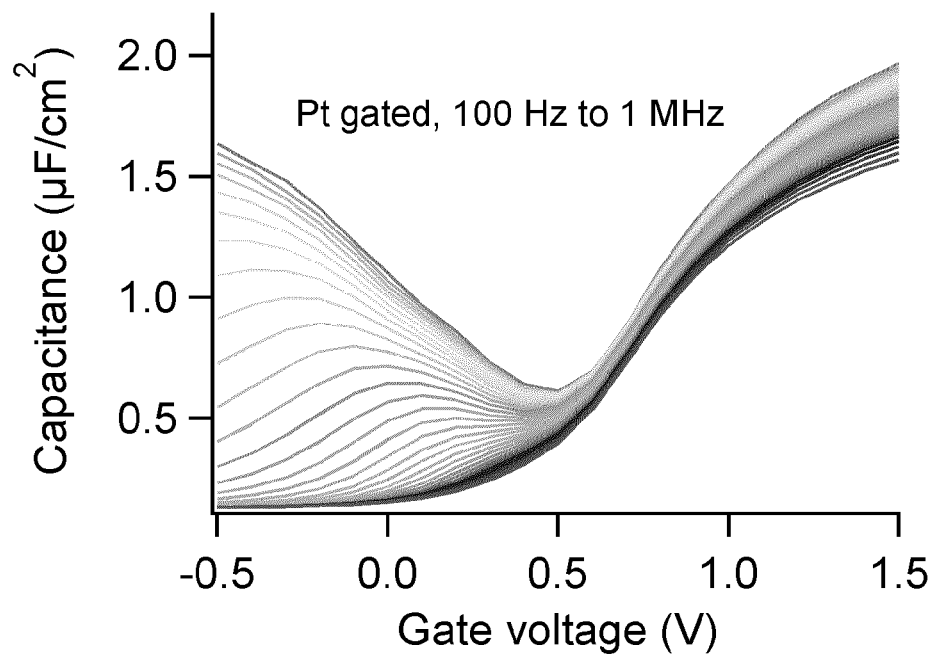
FIG. 5 illustrates a capacitance vs. voltage curve with a frequency dispersion range from 100 Hz to 1 MHz for an interfacial layer.
Figure 6:
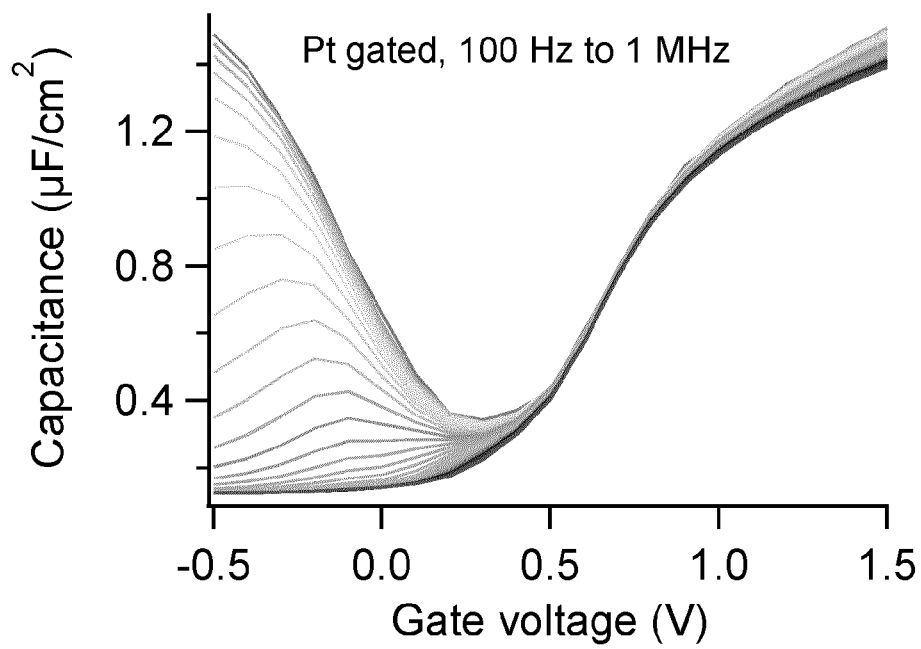
FIG. 6 illustrates a capacitance vs. voltage curve with a frequency dispersion range from 100 Hz to 1 MHz for a sulfur-containing thin film according to one embodiment of the present disclosure.

As shown in Table 1 above, the MgS interfacial layer achieved a marked improved over the $Al_3O_2$ interfacial layer particular with respect to dispersion, which is a reference to the variability of capacitance at various frequencies. FIG. 5 illustrates the undesirable dispersion resulting from the use of an $Al_3O_2$ interfacial layer. FIG. 6 illustrates the drastic reduction in dispersion obtained by using an MgS interfacial layer formed according to the present disclosure. A lower dispersion indicates that the interface layer contains fewer defects.

Example 4

Similar to Examples 1-3, a number of MOSCAP structures were formed, some with interface layers of various compositions and thicknesses and some without interface layers, and their respective properties were measured. Each of the sample structures were formed on InGaAs channels.

In each sample, the substrate surface was first pretreated with a 1 minute exposure to 37% HCl then washed twice for 15 seconds each time with D1 $H_2O$ followed by an exposure to $H_2S$ at 250° C.

These various films demonstrated the benefits achieved by including an interfacial layer comprising a metal sulfide. In particular, it was determined that the use of a metal sulfide thin film as an interfacial layer between a high-mobility channel and a dielectric layer substantially reduced the frequency dispersion of the capacitance-voltage curves of the films. Among the various structures formed, a variety of dielectric materials were used, such as $Al_2O_3$, $AlSiO_x$, $HfO_2$, $HfSiO_x$, and $TaSiO_x$. In a set of control structures, a thin film of aluminum oxide was used as an interface layer. The structures that did not include a metal sulfide interface layer generally exhibited a dispersion as low as 4 and as high as 8.8 with an average of 5.6 and a median of 4.9. Among the structures that included a metal sulfide interface layer, the dispersion was as low as 0.7 and as high as 3.8 with an average of about 1.74 and median of 1.2.

Based on this example, it was determined that using a high-k dielectric directly on an InGaAs nigh-mobility channel did not achieve desirable results. In contrast, a MgS interfacial did achieve desirable results. It was also determined that a pretreatment using TMA provided limited or no benefit.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

We claim:

1. A method of depositing a magnesium sulfide thin film on a substrate in a reaction space, the method comprising one or more deposition cycles comprising:
   providing a vapor-phase magnesium reactant to the reaction space;
   removing excess vapor-phase magnesium reactant and reaction by-products;
   providing a second vapor-phase reactant comprising sulfur to the reaction space; and
   removing excess second reactant and reaction by-products.

2. The method of claim 1, wherein the second reactant is provided to the reaction space before providing the vapor-phase magnesium reactant to the reaction space.

3. The method of claim 1, wherein the magnesium sulfide thin film comprises at least one metal other than magnesium.

4. The method of claim 1, wherein the magnesium reactant comprises at least one cyclopentadienyl (Cp) ligand.

5. The method of claim 1, wherein the magnesium reactant is $Mg(Cp)_2$ or a derivative thereof.

6. The method of claim 1, wherein magnesium is not present on the portion of the substrate upon which the magnesium sulfide thin film is being formed.

7. The method of claim 1, wherein the second reactant is $H_2S$.

8. The method of claim 1, wherein the second reactant comprises sulfur atoms, sulfur-containing plasma, or sulfur-radicals.

9. The method of claim 1, wherein the substrate surface on which the magnesium sulfide thin film is deposited does not include silicon.

10. The method of claim 1, wherein the substrate surface on which the magnesium sulfide thin film is deposited comprises InGaAs.

11. The method of claim 1 further comprising exposing the substrate to a pretreatment reactant either ex situ or in situ prior to depositing the magnesium sulfide thin film.

12. The method of claim 1, wherein the deposited magnesium sulfide thin film has a thickness of between about 1 Å and about 20 Å.

* * * * *